US012765064B2

(12) United States Patent
Yang et al.

(10) Patent No.: US 12,765,064 B2
(45) Date of Patent: Oct. 13, 2026

(54) DISPLAY PANEL AND DISPLAY DEVICE

(71) Applicant: Xiamen Tianma Microelectronics Co., Ltd., Xiamen (CN)

(72) Inventors: Guangdeng Yang, Xiamen (CN); Yiqiang Lin, Xiamen (CN); Dongxu Qiu, Xiamen (CN); Hao Wu, Xiamen (CN); Poping Shen, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 384 days.

(21) Appl. No.: 18/403,805

(22) Filed: Jan. 4, 2024

(65) Prior Publication Data

US 2024/0136366 A1 Apr. 25, 2024
US 2024/0234438 A9 Jul. 11, 2024

(30) Foreign Application Priority Data

Sep. 4, 2023 (CN) ......................... 202311132888.X

(51) Int. Cl.
*G09G 3/20* (2006.01)
*H10D 86/40* (2025.01)
*H10D 86/60* (2025.01)

(52) U.S. Cl.
CPC ........... *H10D 86/60* (2025.01); *H10D 86/441* (2025.01)

(58) Field of Classification Search
CPC ....... G09G 2330/06; G09G 2300/0426; G09G 2310/027; G09G 2320/0209; H10D 86/60; H10D 86/441
See application file for complete search history.

(56) References Cited

U.S. PATENT DOCUMENTS

2018/0336814 A1* 11/2018 Lim ..................... G09G 3/2092
2021/0210022 A1* 7/2021 Chang .................. G09G 3/3266
2022/0216290 A1* 7/2022 Zheng .................... H10K 59/40
2024/0047480 A1* 2/2024 Xu ....................... H10D 86/443

FOREIGN PATENT DOCUMENTS

CN 104503171 4/2015
CN 110658939 A 1/2020
CN 113611240 A 11/2021
CN 114122011 A 3/2022
CN 114185454 A 3/2022
CN 115729004 A 3/2023

OTHER PUBLICATIONS

English translation of CN-115729004-A (Year: 2023).*

* cited by examiner

*Primary Examiner* — Lixi C Simpson
(74) *Attorney, Agent, or Firm* — KDW FIRM PLLC

(57) ABSTRACT

A display panel and a display device are provided. The display panel includes a display region and a non-display region. The non-display region includes a demultiplexing circuit, a fanout wire, and a clock signal line. An input terminal of the demultiplexing circuit is electrically connected to the fanout wire, an output terminal of the demultiplexing circuit is electrically connected to a data line in the display region, and a control terminal of the demultiplexing circuit is electrically connected to the clock signal line. The display panel further includes an isolation signal line including an isolation portion, and an orthographic projection of the isolation portion on a plane where a substrate is located is between an orthographic projection of the clock signal line on the plane where the substrate is located and an orthographic projection of the fanout wire on the plane where the substrate is located.

20 Claims, 10 Drawing Sheets

10

DISPLAY PANEL AND DISPLAY DEVICE

CROSS-REFERENCE TO RELATED APPLICATIONS

This application claims priority to Chinese patent application No. 202311132888.X filed with the China National Intellectual Property Administration (CNIPA) on Sep. 4, 2023, the disclosure of which is incorporated herein by reference in its entirety.

TECHNICAL FIELD

The present disclosure relates to the field of display techniques and, in particular, to a display panel and a display device.

BACKGROUND

With the development of display technology, display panels have been widely used in people's production and life. However, there are still some technical issues to be addressed in the display panels in the related art, for example, interference of signal transmission between different signal lines in the existing display panels and the like.

SUMMARY

A display panel and a display device are provided according to embodiments of the present disclosure, which can avoid the signal coupling between different wires by providing an isolation signal line, thereby ensuring the stability of signal transmission of the display panel.

A display panel is provided according to an embodiment of the present disclosure, and the display panel includes a substrate, a display region and a non-display region.

The display region includes multiple data lines, and the non-display region includes a demultiplexing circuit, a fanout wire, and a clock signal line. An input terminal of the demultiplexing circuit is electrically connected to the fanout wire, an output terminal of the demultiplexing circuit is electrically connected to a data line of the data lines, and a control terminal of the demultiplexing circuit is electrically connected to the clock signal line.

The display panel further includes an isolation signal line, the isolation signal line includes an isolation portion, and an orthographic projection of the isolation portion on a plane where the substrate is located is between an orthographic projection of the clock signal line on the plane where the substrate is located and an orthographic projection of the fanout wire on the plane where the substrate is located.

A display device is provided according to an embodiment of the present disclosure, and the display device includes the display panel according to any feature of the first aspect.

BRIEF DESCRIPTION OF DRAWINGS

To illustrate technical schemes in embodiments of the present disclosure more clearly, drawings used in description of the embodiments are briefly described hereinafter. Apparently, the drawings described hereinafter merely illustrate some embodiments of the present disclosure, and for the person of ordinary skill in the art, other drawings can be obtained based on these drawings without making creative efforts.

DETAILED DESCRIPTION

For enabling the person skilled in the art to better understand the schemes of the present disclosure, the technical schemes in embodiments of the present disclosure are described clearly and completely in conjunction with the drawings in embodiments of the present disclosure. Apparently, the embodiments described below are part, rather than all, of the embodiments of the present disclosure. Based on the embodiments in the present disclosure, all other embodiments obtained by the person skilled in the art on the premise that no creative efforts are made are within the scope of the present disclosure.

It is to be noted that the terms "first", "second" and the like in the description, claims and the above drawings of the present disclosure are intended to distinguish between similar objects and are not necessarily used to describe a particular order or sequence. It is to be appreciated that the data used in this way is interchangeable where appropriate so that the embodiments of the present disclosure described herein may also be implemented in a sequence besides those sequences illustrated or described herein. Furthermore, terms such as "include", "have"; and any deformation thereof, are intended to cover non-exclusive inclusion, e.g., a system, product, or apparatus including a series of units is not necessarily limited to those steps or units expressly listed, but may include other units not expressly listed or inherent to such system, product or apparatus.

Figure 1:
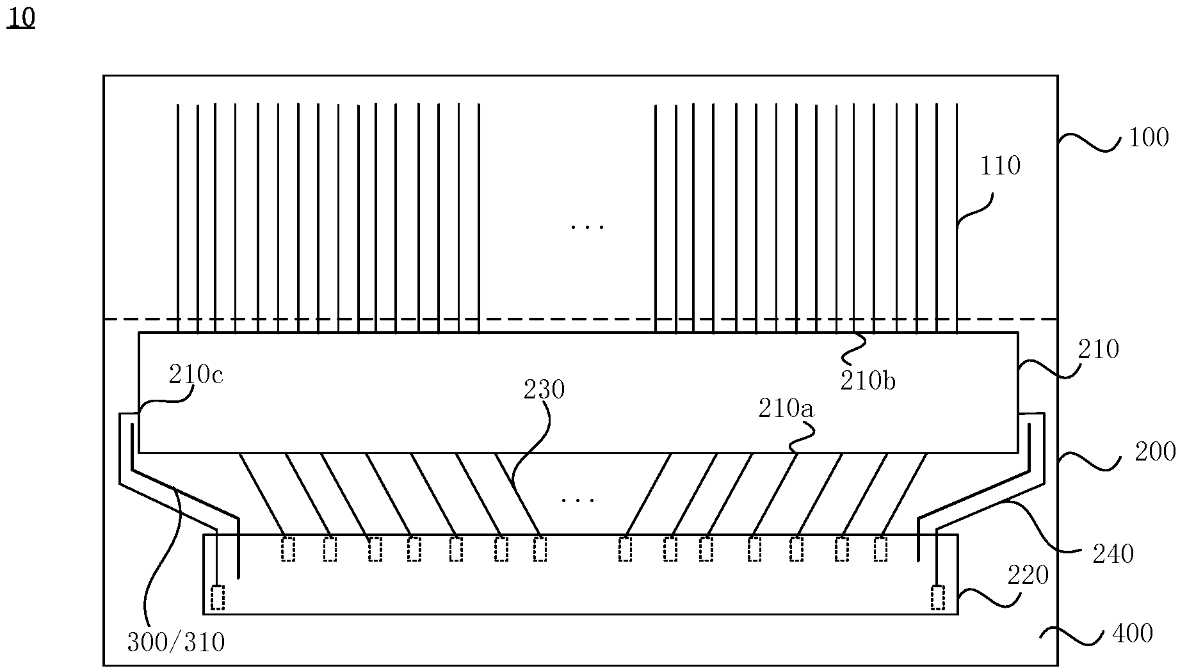
FIG. 1 is a schematic structural diagram of a display panel according to an embodiment of the present disclosure.
Figure 2:
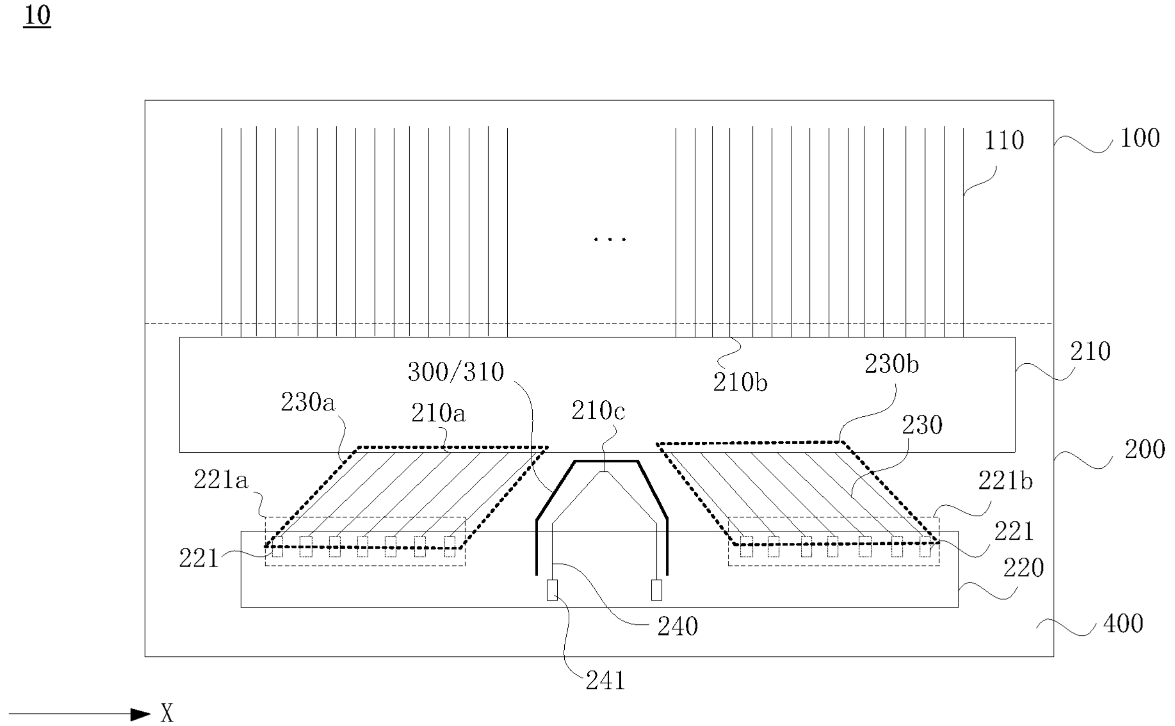
FIG. 2 is a schematic structural diagram of another display panel according to an embodiment of the present disclosure.
Figure 3:
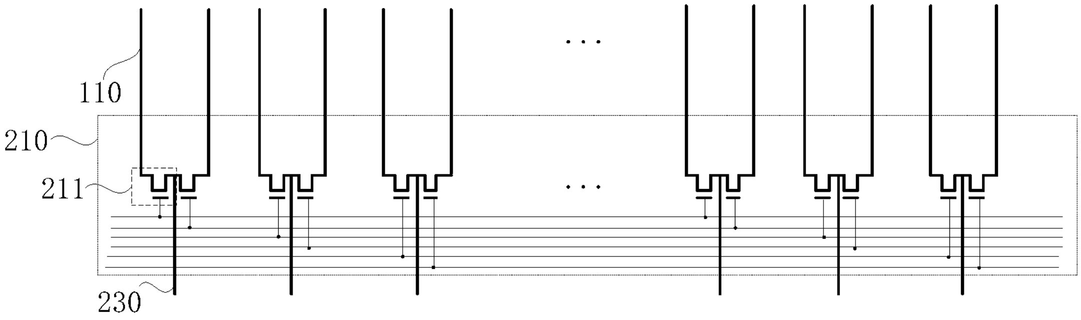
FIG. 3 is a schematic structural diagram of a demultiplexing circuit according to an embodiment of the present disclosure.

FIG. 1 is a schematic structural diagram of a display panel according to an embodiment of the present disclosure, FIG. 2 is a schematic structural diagram of another display panel according to an embodiment of the present disclosure, and FIG. 3 is a schematic structural diagram of a demultiplexing circuit according to an embodiment of the present disclosure. Referring to FIG. 1 to FIG. 3, a display panel 10 provided by an embodiment of the present disclosure includes a display region 100 and a non-display region 200. The display region 100 includes multiple data lines 110. The non-display region 200 includes a demultiplexing circuit 210, a fanout wire 230, and a clock signal line 240. Input terminals 210*a* of the demultiplexing circuit 210 are electrically connected to the fanout wire 230, output terminals 210*b* of the demultiplexing circuit 210 are electrically connected to the data lines 110, and a control terminal 210*c* of the demultiplexing circuit 210 is electrically connected to the clock signal line 240. The display panel 10 further includes an isolation signal line 300, the isolation signal line 300 includes an isolation portion 310, and an orthographic projection of the isolation portion 310 on a plane where a substrate 400 is located is between an orthographic projection of the clock signal line 240 on the plane where the substrate 400 is located and an orthographic projection of the fanout wire on the plane where the substrate 400 is located.

Referring to FIG. 1 and FIG. 2, the display panel 10 includes the display region 100 and the non-display region 200. The display region 100 includes multiple sub-pixels, multiple pixel circuits (not shown in the drawings) and multiple data lines 110, display signals are transmitted to the pixel circuits through the data lines 110, and the pixel circuits drive the sub-pixels to emit light, thereby ensuring the display effect of the display region.

For example, the sub-pixels in the display region 100 may be organic light-emitting diodes (OLED), mini light-emitting diodes (LEDs), micro LEDs, quantum dot light-emitting diodes (QLED) or liquid crystal sub-pixels, etc., which are not limited in the similar embodiments of the present disclosure. The sub-pixels may include red sub-pixels, green sub-pixels, and blue sub-pixels. The arrangement of sub-pixels of different colors may be a diamond pixel arrangement, and may also be a standard red/green/blue (RGB) arrangement, a delta pixel arrangement, a pearl pixel arrangement, a 2in1 pixel arrangement, or the like. The arrangement of the sub-pixels is not limited by the embodiments of the present disclosure.

For example, the pixel circuit for electrically connecting the sub-pixels may be a "2T1C" circuit, a "7T1C" circuit, a "7T2C" circuit, or the like. The "2T1C circuit" refers to that the pixel circuit includes two thin-film transistors (T) and one capacitor (C), and the "7T1C" circuit and "7T2C" circuit may be deduced by analogy. The number of thin-film transistors and capacitors in the pixel circuit may be set by the person skilled in the art according to practical requirements, which is not further described and limited by the embodiments of the present disclosure.

The non-display region 200 at least partially surrounds the display region 100, and the non-display region 200 may be a lower bezel region of the display panel 10. The non-display region 200 includes a demultiplexing circuit 210, a fanout wire 230 and a clock signal line 240. The demultiplexing circuit 210 is electrically connected to the fanout wire 230, the clock signal line 240 and the data lines 110, respectively, so as to realize that one fanout wire 230 may be electrically connected to multiple data lines 110, thereby facilitating the realization of a narrow bezel design of the display panel 10 while ensuring the display effect of the display panel 10. The demultiplexing circuit 210 is a combinational logic circuit that may assign an input signal transmitted by one input line to any one of multiple individual output lines at a time. Referring to FIG. 3, the demultiplexing circuit 210 may include multiple switch units 211, and each switch unit 211 includes a control terminal, an input terminal and an output terminal. Further, the clock signal line 240 is electrically connected to the control terminal 210*c* of the demultiplexing circuit 210, which is equivalent to that the clock signal line 240 is electrically connected to the control terminal of a switch unit 211. The fanout wire 230 is electrically connected to the input terminal 210*a* of the demultiplexing circuit 210, which is equivalent to that the fanout wire 230 is electrically connected to the input terminal of the switch unit 211. The data line 110 is electrically connected to the output terminal 210*b* of the demultiplexing circuit 210, which is equivalent to that the data line 110 is electrically connected to the output terminal of the switch unit 211. In other words, the clock signal provided by the clock signal line 240 is transmitted to the demultiplexing circuit 210 to control signal transmission and signal blocking of different fanout wires 230 with corresponding multiple data lines 110.

Further, the fanout wire 230 and the clock signal line 240 transmit different signals respectively, for example, the fanout wire 230 transmits a data signal for display, and the clock signal line 240 transmits a clock control signal for controlling the switch units 211 to be turned on or off. When the two types of wires are relatively close to each other, signal coupling is caused between the fanout wire 230 and the clock signal line 240, and interference is generated between the clock signal line 240 and the fanout wire 230. In particular, the signal in the fanout wire 230 causes relatively large interference on the clock signal of the clock signal line 240, which adversely affects the accuracy and stability of the signal transmission of both the fanout wire 230 and the clock signal line 240. Based on this, the display panel 10 according to an embodiment of the present disclosure further includes an isolation signal line 300, and the isolation signal line 300 includes an isolation portion 310 located between the clock signal line 240 and the fanout wire 230 in the direction of the projection on the substrate 400. With reference to FIG. 1 and FIG. 2, the magnitude of the coupling capacitance present between the clock signal line 240 and the fanout wire 230 can be reduced, the interference between the clock signal line 240 and the fanout wire 230 can be effectively eliminated, the transmission accuracy of the fanout wire 230 and the clock signal line 240 can be improved, and further the display effect of the display panel 10 as a whole can be ensured.

It is to be noted that FIG. 1 and FIG. 2 are merely intended to embody the arrangement features of some wires in the non-display region 200, and the occupation ratios of the non-display region 200 and the display region 100 in the drawings do not represent the practical ratios, and it is the same case in the drawings referred subsequently, which is not explained for the drawings one by one.

In summary, in the display panel according to the embodiment of the present disclosure, the orthographic projection of the isolation portion on the plane where the substrate is located is between the orthographic projection of the clock signal line on the plane where the substrate is located and the orthographic projection of the fanout wire on the plane where the substrate is located, the isolation portion can block interference between the signals of the clock signal line and the fanout wire, reduce the coupling between the clock signal line and the fanout wire, ensure the stability of overall signal transmission of the display panel, and further ensure display effect of the display panel.

With continued reference to FIG. 2, the display panel 10 includes a first fanout wire group 230*a* and a second fanout wire group 230*b*, and each of the first fanout wire group 230*a* and the second fanout wire group 230*b* includes multiple fanout wires 230. The display panel 10 further includes a first output terminal group 221*a* and a second output terminal group 221*b*, and each of the first output terminal group 221*a* and the second output terminal group 221*b* includes multiple outputs bonding terminals 221. The fanout wires 230 in the first fanout wire group 230*a* are electrically connected to the output bonding terminals 221 of the first output terminal group 221*a*, and the fanout wires 230 in the second fanout wire group 230*b* are electrically connected to the output bonding terminals 221 of the second output terminal group 221*b*. The first output terminal group 221*a* and the second output terminal group 221*b* are arranged in a first direction X, and the first direction X is in parallel with the plane on which the substrate 400 is located. In the first direction X, at least a portion of the clock signal line 240 is located between the first output terminal group 221*a* and the second output terminal group 221*b*.

Referring to FIG. 2, the display panel 10 includes a first fanout wire group 230*a* and a second fanout wire group 230*b*, and the first fanout wire group 230*a* and the second fanout wire group 230*b* each include multiple fanout wires 230. The extension directions of the fanout wires 230 in the first fanout wire group 230*a* and the second fanout wire group 230*b* may intersect with the first direction X, and the extension direction of the fanout wires in the first fanout wire group 230*a* intersects with the extension direction of the fanout wires in the second fanout wire group 230*b*. Further, the display panel 10 further includes multiple output bonding terminals 221, the output bonding terminals 221 can be understood as terminals being in bonding electrical connection with bonding terminals on a driver chip 220 and partially used for outputting display signals (e.g., data signals). Since the driver chip 220 in the drawings may cover the output bonding terminals 221, the output bonding terminals 221 are shown in dashed lines. In an embodiment, the display panel 10 includes the first output terminal group 221*a* and the second output terminal group 221*b*, the multiple output bonding terminals 221 included in the first output terminal group 221*a* are electrically connected to the first fanout wire group 230*a*, for outputting the display signals through the first fanout wire group 230*a* to sub-pixels in the display region, and the multiple output bonding terminals 221 included in the second output terminal group 221*b* are electrically connected to the fanout wires 230 in the second fanout wire group 230*b*, for outputting the display signals through the second fanout wire group 230*b* to sub-pixels in the display region. In this manner, the display function of the display region is realized.

Further, with continued reference to FIG. 2, at least a portion of the clock signal line 240 is located between the first output terminal group 221*a* and the second output terminal group 221*b*, i.e., the clock signal line 240 is located between the two groups of fanout wires 230. Referring to FIG. 1, when the clock signal line 240 is located on both sides of the fanout wires 230, the clock signal line 240 has a relatively small slope, and occupies a relatively large space in the direction from the display region to the non-display region; when the clock signal line 240 is arranged between the two groups of the fanout wires 230, the clock signal line 240 may be electrically connected to the demultiplexing circuit 210 in the middle, and in this case, the clock signal line 240 has a relatively large slope, and occupies a relatively small space in the direction from the display region to the non-display region. Therefore, the case where the clock signal line 240 with a small slope occupies a large wiring space does not exist, the space occupied by the non-display region of the display panel 10 can be reduced effectively, and the narrow bezel design of the display panel 10 can be effectively realized.

Figure 4:
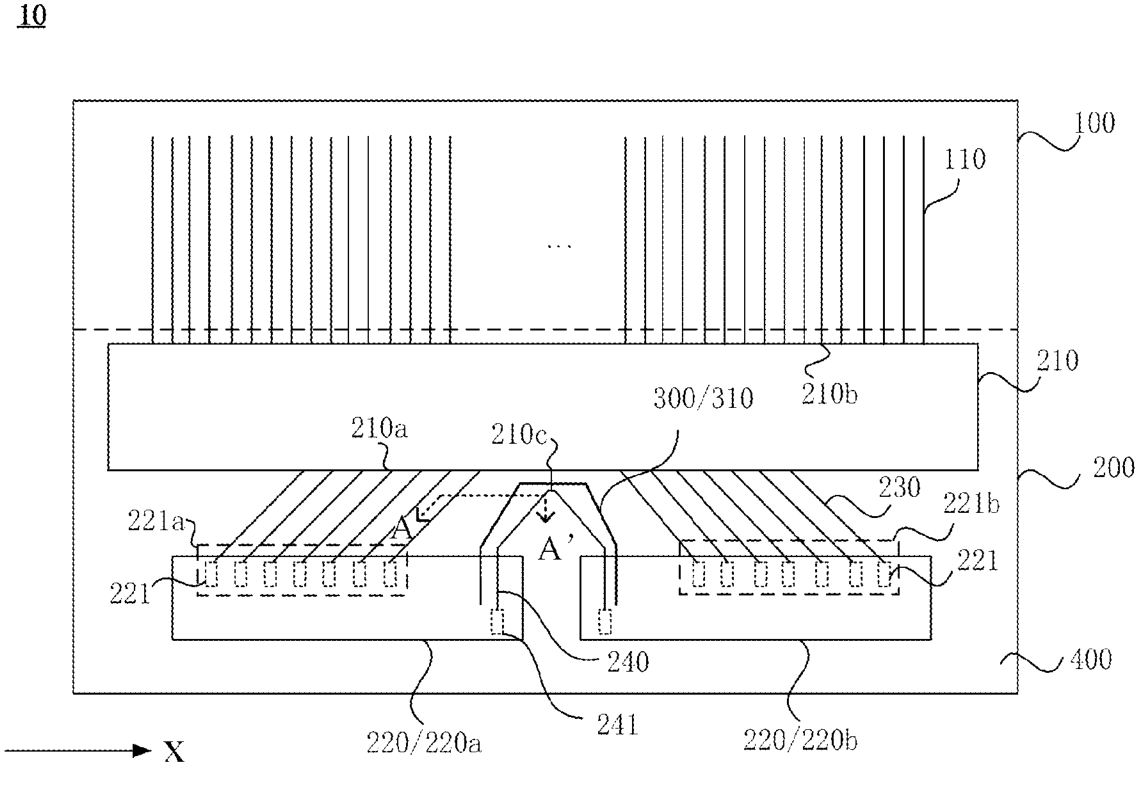
FIG. 4 is a schematic structural diagram of another display panel according to an embodiment of the present disclosure.

Further, as shown in FIG. 2, the display panel according to an embodiment of the present disclosure further includes a clock signal terminal 241 arranged in the non-display region, and the clock signal terminal 241 may be electrically connected to the clock signal line 240, to provide a clock signal to the clock signal line 240. It is to be noted that the arrangement position of the clock signal terminal 241 is not limited by the embodiments of the present disclosure. For example, the clock signal terminal 241 may not be arranged in the same row as the output bonding terminals 221 connected to the fanout wires 230, as shown in FIG. 2. Alternatively, the clock signal terminal 241 may be arranged in the same row as the output bonding terminals 221 (not shown in the drawings) connected to the fanout wires 230. Further, the clock signal terminal 241 may be arranged between the two output terminal groups, as shown in FIG. 2, in this way, the connection relationship between the clock signal line 240 and the clock signal terminal 241 is relatively simple. Further, as shown in FIG. 4, the display panel 10 may include multiple driver chips 220, different driver chips 220 include clock signal terminals 241, and the clock signal lines 240 connected to the clock signal terminals 241 of the different driver chips 220 are also located between the two output terminal groups, and the multiple clock signal lines 240 are converged and connected between the two output terminal groups, and then connected to the demultiplexing circuit 210. By adjusting the arrangement positions of the clock signal terminals 241 and the clock signal lines 240, it is possible to ensure that the overall wiring lengths of the clock signal lines 240 are relatively short, thereby reducing the loss of the signal during transmission. Alternatively, the clock signal terminals may also be arranged at other positions, and the electrical connection relationship between the clock signal lines and the clock signal terminals may be realized by adjusting the wiring manner of the clock signal lines. In this way, the arrangement of the clock signal terminal can be flexible and variable, and can match different display panel designs. The arrangement manner of the clock signal terminals is not limited by the embodiments of the present disclosure.

FIG. 4 is a schematic structural diagram of another display panel according to an embodiment of the present disclosure. Referring to FIG. 4, the display panel 10 further includes a first driver chip 220*a* and a second driver chip 220*b*, the first driver chip 220*a* is bound and electrically connected to the first output terminal group 221*a*, and the second driver chip 220*b* is bounded and electrically connected to the second output terminal group 221*b*.

Referring to FIG. 4, the display panel 10 may include a first driver chip 220*a* and a second driver chip 220*b*. The first driver chip 220*a* is bound and electrically connected to output bonding terminals 221 in the first output terminal group 221*a*, and the second driver chip 220*b* is bound and electrically connected to output bonding terminals 221 in the second output terminal group 221*b*. In other words, the multiple output bonding terminals 221 are bound to the two driver chips 220, and the multiple output bonding terminals 221 receive the display signals provided by the two driver chips 220, so that the operation amount of each driver chip can be reduced to improve the overall operation efficiency of the display panel 10, and further ensure the accuracy of the operation, thereby ensuring the transmission effect of the signals, and ensuring the display effect of the display panel 10. In addition, the display panel includes two driver chips, and each driver chip has a small size, so that the technique difficulty and the manufacturing cost of the driver chips can further be reduced.

Further, referring to FIG. 2, the clock signal terminals 241 are provided in the central region of the driver chip 220, or referring to FIG. 4, a clock signal terminal 241 is provided on a side of the first driver chip 220*a* facing the second driver chip 220*b*, and a clock signal terminal 241 is provided on a side of the second driver chip 220*b* facing the first driver chip 220*a*. The preceding manners may be understood as arranging the clock signal line 240 electrically connected to the clock signal terminal 241 in the central region of the whole, thus ensuring the balance of the clock signal transmission, thereby effectively mitigating the case of the split screen display that may occur on the display panel 10. In an embodiment, if the clock signal lines 240 are placed in the central region of the whole, the signal coupling issue caused by the clock signal lines 240 and the fanout wires 230 may become more serious, and the necessity of arranging the isolation signal line 300 in the display panel 10 may be reflected.

Figure 5:
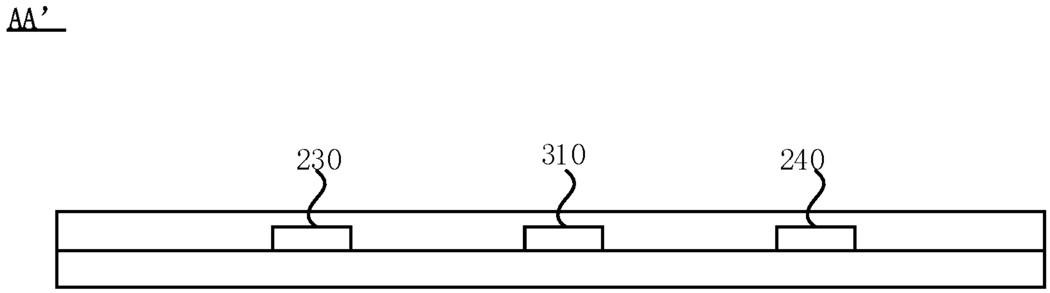
FIG. 5 is a schematic sectional view taken along A-A' in FIG. 4.

FIG. 5 is a schematic sectional view taken along A-A' in FIG. 4; referring to FIG. 4 and FIG. 5, a film layer in which an isolation portion 310 is located is not out of a range defined by a film layer in which the fanout wire 230 is located and a film layer in which the clock signal line 240 is located.

Referring to FIG. 4 and FIG. 5, the film layer in which the isolation portion 310 is located is not out of the film layer range defined by the film layer in which the fanout wire 230 is located and the film layer in which the clock signal line 240 is located, which can be understood as that the isolation portion 310 is located in the same layer as at least one of the clock signal line 240 and the fanout wire 230, or the isolation portion 310 is located between the film layer in which the fanout wire 230 is located and the film layer in which the clock signal line 240 is located. That is to say, through the limitation on the film layers in which the fanout wire 230, the clock signal line 240 and the isolation portion 310 are located, it can be ensured that the isolation portion 310 has an isolation effect on the coupling capacitance between the clock signal line 240 and the fanout wire 230, thereby ensuring stable transmission of signals in the clock signal line 240 and the fanout wire 230, and ensuring the display effect of the display panel 10.

Figure 6:
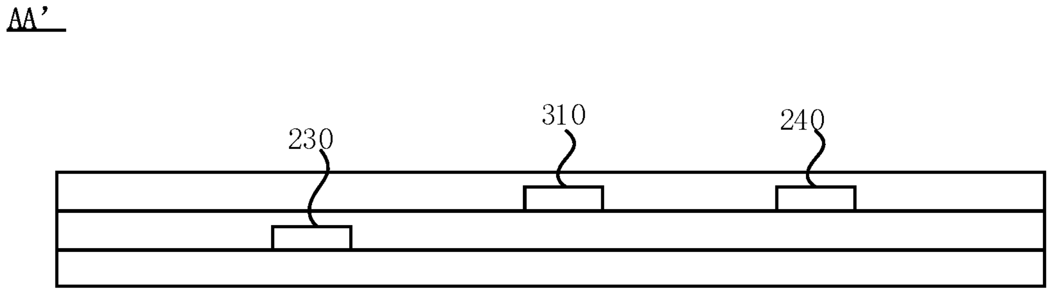
FIG. 6 is another schematic sectional view taken along A-A' in FIG. 4.
Figure 7:
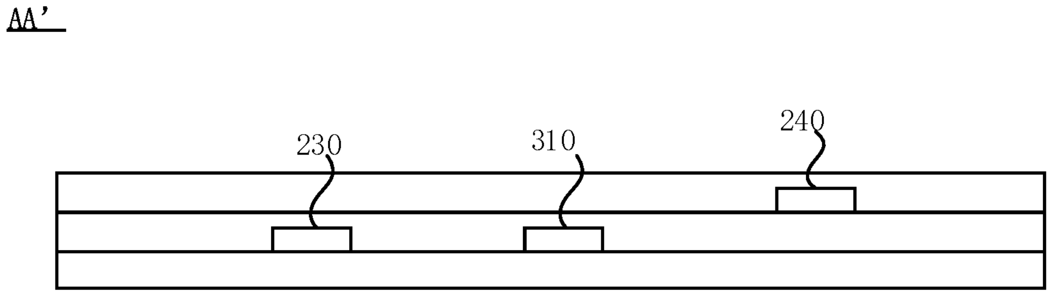
FIG. 7 is another schematic sectional view taken along A-A' in FIG. 4.

With the adjustment for the arrangement position of the film layer of the isolation portion 310, the interference between the clock signal line 240 and the fanout wire 230 can be effectively avoided, the signal transmission accuracy can be improved, and the display effect can be improved. In an embodiment, FIG. 6 is another schematic sectional view taken along A-A' in FIG. 4, and FIG. 7 is another schematic sectional view taken along A-A' in FIG. 4. Referring to FIG. 5 to FIG. 7, the isolation portion 310 is arranged in the same layer as the fanout wire 230, and/or the isolation portion 310 is arranged in the same layer as the clock signal line 240.

In an embodiment, the projection of the isolation portion 310 on the substrate 400 is located between the projection of the clock signal line 240 on the substrate 400 and the projection of the fanout wire 230 on the substrate 400. Moreover, in the thickness direction of the display panel 10, the film layer in which the isolation portion 310 is arranged is not out of the range defined by the film layer in which the fanout wire 230 is located and the film layer in which the clock signal line 240 is located, thereby effectively ensuring that the isolation portion 310 plays a role of isolating the signal interference between the clock signal line 240 and the fanout wire 230 in different dimensions.

For example, referring to FIG. 5, when the fanout wire 230 and the clock signal line 240 are arranged in the same layer, the isolation portion 310, the fanout wire 230 and the clock signal line 240 are all arranged in the same layer, and an orthographic projection of the isolation portion 310 in the plane where the substrate 400 is located is between an orthographic projection of the clock signal line in the plane where the substrate 400 is located and an orthographic projection of the fanout wire 230 in the plane where the substrate 400 is located. In this way, the isolation and shielding effect of the isolation portion 310 on the signals in the fanout wire 230 and the clock signal line 240 can be ensured, and stable transmission of the signals in the fanout wire 230 and the clock signal line 240 can be ensured. Meanwhile, the same layer arrangement can reduce the film layer thickness of the display panel 10 and facilitate the implementation of a thin design of the display panel 10.

Illustratively, referring to FIG. 6 and FIG. 7, in a case where the fanout wire 230 and the clock signal line 240 are arranged in different layers, the isolation portion 310 is arranged in the same layer as any one of the clock signal line 240 and the fanout wire 230, the isolation portion 310 and the clock signal line 240 are arranged in the same layer in FIG. 6, and the isolation portion 310 and the fanout wire 230 are arranged in the same layer in FIG. 7, thus the film layer in which the isolation portion 310 is arranged is ensured to be not out of the range defined by the film layer in which the fanout wire 230 is located and the film layer in which the clock signal line 240 is located, thereby reducing the signal interference between the clock signal line 240 and the fanout wire 230.

Figure 8:
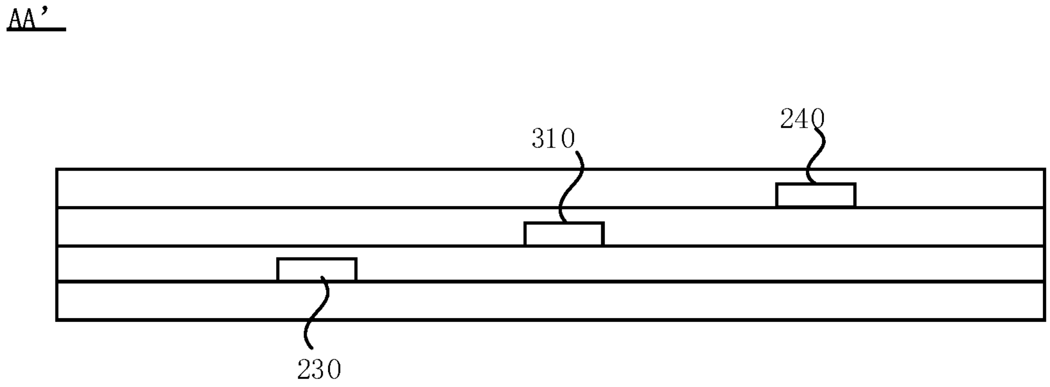
FIG. 8 is another schematic sectional view taken along A-A' in FIG. 4.

In an embodiment, FIG. 8 is another schematic sectional view taken along A-A' in FIG. 4. Referring to FIG. 8, the fanout wire 230 is arranged in a different film layer from the film layer in which the clock signal line 240 is arranged, and the film layer in which the isolation portion 310 is located is between the film layer in which the fanout wire 230 is located and the film layer in which the clock signal line 240 is located.

Referring to FIG. 8, in the case where the fanout wire 230 is arranged in a different film layer from the film layer in which the clock signal line 240 is arranged, the isolation portion 310 may be arranged between the film layers in which these two kinds of wires are located. In this manner, it can also ensure that the isolation portion 310 is arranged between the clock signal line 240 and the fanout wire 230, the relative spacing between the clock signal line 240 and the fanout wire 230 is maximized, and the signal interference between the clock signal line 240 and the fanout wire 230 can also be reduced.

On the basis of the embodiments described above, the film layer in which the isolation signal line is located is not limited by the embodiments of the present application. For example, the display panel may include a first metal layer, a second metal layer, a third metal layer, a fourth metal layer, a fifth metal layer and a sixth metal layer. The first metal layer may include a gate of a low-temperature polysilicon thin-film transistor, the second metal layer may include one of the capacitor substrates of a storage capacitor, the third metal layer may include a gate of an oxide thin-film transistor, the fourth metal layer may include a jumper structure between other metal layers, the fifth metal layer may include a source and a drain of the thin-film transistor, and the sixth metal layer may include connection wires in the structure of fanout wires arranged in the display region. The fanout in AA (FIAA) structure may be understood as that a fanout wire located in the non-display region (e.g., a fanout wire region) is electrically connected to a data signal line in the display region by a connecting wire in the display region, in this way, the number of wires arranged in the fanout wire region can be reduced and the space occupied by the non-display region of the display panel 10 can be reduced. When the fanout wire, the isolation signal line and the clock signal line are arranged in the same layer, the three may be located in any one of the first metal layer to the sixth metal layer mentioned above, for example, the first metal layer, the second metal layer, the third metal layer, the fourth metal layer, or the like. When the isolation signal line is arranged in the same layer as the fanout wire but in a different layer from the clock signal line, the isolation signal line may be located in any one of the first metal layer to the sixth metal layer, and the clock signal line is located in any one of the layers different from the layer of the isolation signal line. For example, the isolation signal line and the fanout wire are located in the first metal layer, and the clock signal line is located in the second metal layer, the third metal layer, the fourth metal layer, or the like. When the isolation signal line is arranged in the same layer as the clock signal line but in a different layer from the fanout wire, the isolation signal line may be located in any one of the first metal layer to the sixth metal layer mentioned above, and the fanout wire is located in any one of the layers different from the layer of the isolation signal line. For example, the isolation signal line and the clock signal line are located in the first metal layer, and the fanout wire is located in the second metal layer, the third metal layer, the fourth metal layer, or the like. When the isolation signal line is located between the film layer where the fanout wire is located and the film layer where the clock signal line is located, the fanout wire, the isolation signal line, and the clock signal line are all arranged in different layers, and it is required to ensure that the isolation signal line is located between the film layer where the fanout wire is located and the film layer where the clock signal line is located. For example, the fanout wire is located in the first metal layer, the isolation signal line is located in the second metal layer, the clock signal line is located in the third metal layer, and for another example, the clock signal line is located in the first metal layer, the isolation signal line is located in the third metal layer, and the fanout wire is located in the fourth metal layer. The film layers where the fanout wire, the isolation signal line, and the clock signal line are located are not limited by the embodiments of the present disclosure, the fanout wire, the isolation signal line, and the clock signal line may be located in the metal layers in an existing display panel, thus ensuring that the film layer arrangement of the fanout wire, the isolation signal line and the clock signal line is simple, and also facilitating the simplicity of the film layer arrangement of the entire display panel.

Figure 9:
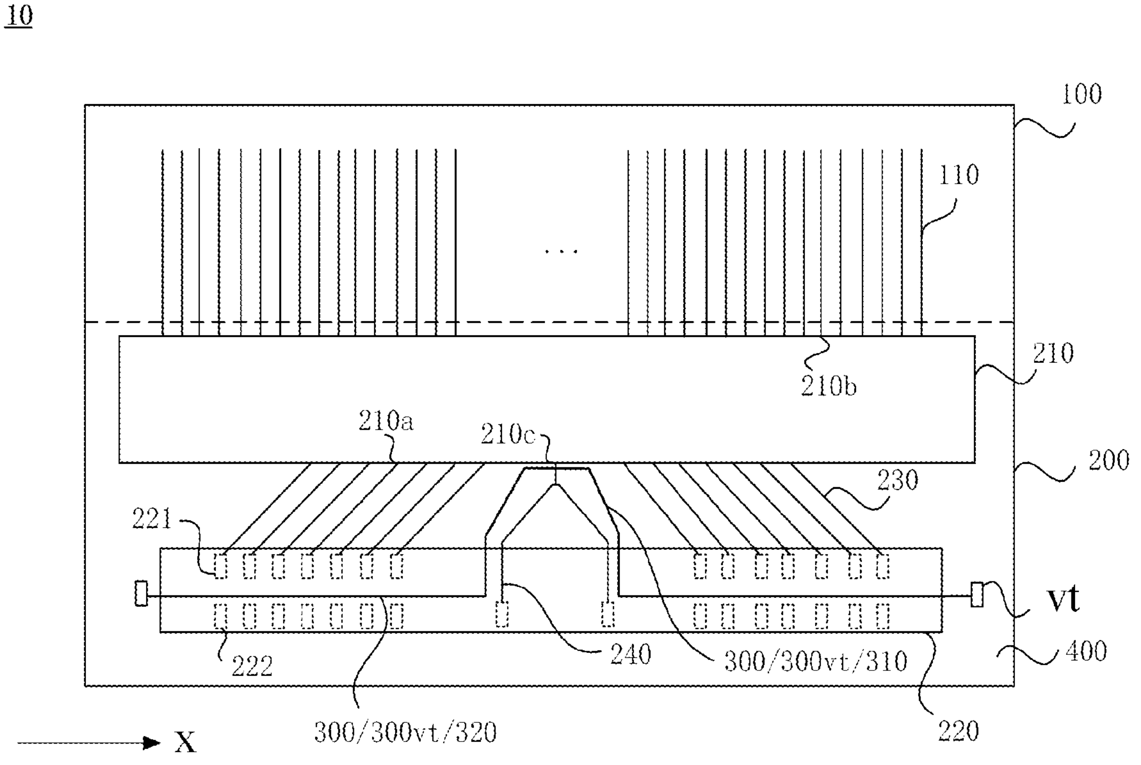
FIG. 9 is a schematic structural diagram of another display panel according to an embodiment of the present disclosure.

FIG. 9 is a schematic structural diagram of another display panel according to an embodiment of the present disclosure. Referring to FIG. 2 and FIG. 9, the isolation signal line 300 includes a fixed potential signal line.

Referring to FIG. 2 and FIG. 9, the isolation signal line 300 may receive a fixed potential, the isolation signal line 300 may be a fixed potential signal line, and the potential signal received by the isolation signal line 300 may be adaptively adjusted according to practical conditions, which is not limited by the embodiments of the present disclosure. By connecting the isolation signal line 300 to a fixed potential, the isolation portion 310 may form fixed capacitances with the fanout wire 230 and the clock signal line 240, respectively, thereby ensuring the stable potentials of the fanout wire 230 and the clock signal line 240 and ensuring a high anti-interference capacity. Further, after the fixed potential is connected to the isolation portion 310, the isolation portion 310 may not sense or couple other potential signals, thereby avoiding secondary interference to the clock signal line 240 and the fanout wire 230, ensuring stable potentials of the fanout wire 230 and the clock signal line 240, and the stable transmission of signals in the fanout wire 230 and the clock signal line 240, and further ensuring the overall display effect of the display panel 10.

In an embodiment, with continued reference to FIG. 2, the isolation signal line 300 includes at least one of a display test signal line 300*vt*, a common voltage signal line, and an electrostatic lead-out wire.

Referring to FIG. 2, the isolation signal line 300 may be the display test signal line, the common voltage signal line, the electrostatic lead-out wire, and a signal wire with a fixed potential, the type of the isolation signal line 300 is not limited by the embodiments of the present disclosure. In an embodiment, the display test signal line is a signal wire configured to implement a visual test (VT) for the display panel 10; the common voltage signal line may be some data wires for providing a common voltage signal in the display panel 10, for example, a positive power signal line PVDD or a negative power signal line PVEE, or the common voltage signal line may be independently arranged common voltage signal line; and the electrostatic lead-out wire may be a signal line in the display panel 10 for leading static electricity generated in the display panel out of the display panel.

Further, the isolation signal line 300 for isolating the fanout wire 230 from the clock signal line 240 may be more than just a fixed potential signal line, for example, the isolation signal line 300 may include both the display test signal line and the common voltage signal line, the quantity and type of the isolation signal line are not limited by the embodiments of the present disclosure. Meanwhile, in this manner, it can further reflect the flexibility of the arrangement of the isolation signal line 300.

Figure 10:
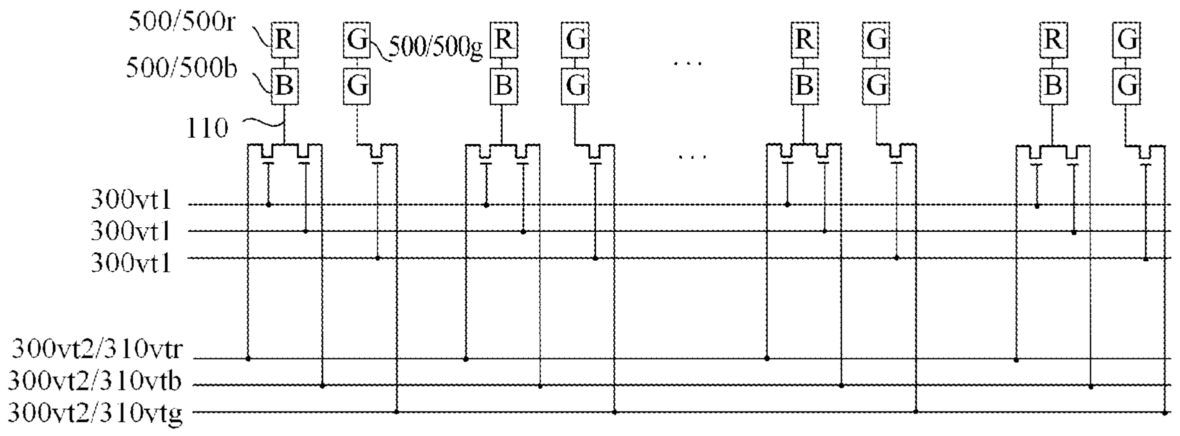
FIG. 10 is a schematic diagram showing a display test structure according to an embodiment of the present disclosure.

In an embodiment, FIG. 10 is a schematic diagram of a display test structure according to an embodiment of the present disclosure. Referring to FIG. 9 and FIG. 10, the isolation signal line 300 includes a display test signal line 300*vt*; the display panel 10 includes a display test signal terminal vt; and the display test signal line 300*vt* includes an isolation portion 310 and a first connection portion 320. The first connection portion 320 is electrically connected to the display test signal terminal vt and the isolation portion 310, respectively. The display panel 10 further includes an input bonding terminal 222 and an output bonding terminal 221, both the input bonding terminal 222 and the output bonding terminal 221 are connected to the driver chip 220 in a bonding manner. An orthographic projection of a portion of the first connection portion 320 on the plane where the substrate 400 is located is between an orthographic projection of the input bonding terminal 222 on the plane where the substrate 400 is located and an orthographic projection of the output bonding terminal 221 on the plane where the substrate 400 is located.

Before the driver chip 220 is bound to the display panel 10, a visual test, that is, a VT test, is generally performed to verify the display effect of the display panel 10, and the display test signal line 300*vt* is used for receiving a signal output by the display test signal terminal vt is received by the display test signal line 300*vt*, so that the screen of the display panel 10 may display a pure color image or a checkerboard image, thereby implementing the test of the display panel 10.

Further, referring to FIG. 9 and FIG. 10, the isolation signal line 300 may be the display test signal line 300*vt*, the interference of signal transmission between the clock signal line 240 and the fanout wire 230 is isolated by the display test signal line 300*vt*, thereby ensuring the stable transmission of signals in the display panel 10 and ensuring the display effect of the display panel 10.

In an embodiment, the display test signal line 300*vt* includes the isolation portion 310 and the first connection portion 320. The orthographic projection of the isolation portion 310 on the plane where the substrate 400 is located is between the orthographic projection of the clock signal line 240 on the plane where the substrate 400 is located and the orthographic projection of the fanout wire 230 on the plane where the substrate 400 is located, for reducing the signal interference between the clock signal line 240 and the fanout wire 230. The first connection portion 320 is configured to electrically connect the display test signal terminal vt to the isolation portion 310, thus, it can be ensured through the first connection portion 320 that the fixed potential signal is connected to the isolation portion 310, and the shielding on signals is implemented, thereby further ensuring the display stability of the display panel 10. It is to be noted that, as shown in FIG. 10, the display test signal line 300*vt* may include multiple wires, there are multiple display test signal terminals vt correspondingly connected to the display test signal lines 300*vt*, and the number of the display test signal terminals vt and the display test signal lines 300*vt* is not limited by the embodiments of the present disclosure. FIG. 9 simply shows for the purpose of illustration that the isolation signal line 300 includes the display test signal line, but does not show the number of display test signal lines.

Further, the display panel 10 also includes an input bonding terminal 222 and an output bonding terminal 221, and the input bonding terminal 222 and the output bonding terminal 221 are configured to be electrically connected to the driver chip 220 in a bonding manner. The related signals enter the driver chip 220 through the input bonding terminal 222 and are subjected to related calculations, and the signals after the calculation process are transmitted to the fanout wire 230 through the output bonding terminal 221. A certain distance exists between the input bonding terminal 222 and the output bonding terminal 221, and a portion of the first connection portion 320 in the display test signal line 300*vt* is disposed between the input bonding terminal 222 and the output bonding terminal 221, so that an additional wiring space cannot be provided for the display test signal line 300*vt*, facilitating implementation of a narrow bezel design of the display panel 10. For example, referring to FIG. 9, an orthographic projection of a portion of the first connection portion 320 on a side of the substrate 400 is located between the input bonding terminal 222 and the output bonding terminal 221.

In an embodiment, referring to FIG. 10, the display test signal line 300*vt* includes a display test switch signal line 300*vt*1 and/or a display test data signal line 300*vt*2.

In an embodiment, the display test signal line 300*vt* includes the display test switch signal line 300*vt*1 and the display test data signal line 300*vt*2. The display test switch signal line 300*vt*1 is configured to control the on/off state of a switch unit in the display test structure, and the display test data signal line 300*vt*2 is configured to transmit a display test signal to the data line 110 through the switch unit in the display test structure. FIG. 10 illustrates by taking the case that the display test structure includes three display test data signal lines 300*vt*2 and three display test switch signal lines 300*vt*1 as an example. The three display test data signal lines 300*vt*2 may be a red display test data signal line 300*vt*2*r*, a blue display test data signal line 300*vt*2*b*, and a green display test data signal line 300*vt*2*g*, respectively, which correspondingly provide a red display test signal, a blue display test signal, and a green display test signal, and the correspondingly connected sub-pixels 500 include a red sub-pixel 500*r*, a blue sub-pixel 500*b*, and a red sub-pixel 500*g*. It is to be noted that FIG. 10 is simply a schematic diagram. The number of the display test signal lines 300*vt* is not limited by the embodiments of the present disclosure, and different numbers and different forms of the display test signal lines may be set according to the requirements for the test functions.

In an embodiment, the VT test is to provide a potential signal for the display test purpose to the display test switch signal line and the display test data signal line through test equipment, and after the VT test finishes, a fixed potential signal is provided for at least part of signal lines in the display test switch signal lines 300*vt*1 and the display test data signal lines 300*vt*2 by a driver chip 220 or a flexible circuit board, so that the display test signal line also serves as the isolation wire between the clock signal line and the fanout wire, thus the issue of signal coupling between the clock signal line and the fanout wire can be reduced, the stability of the signals transmitted in the fanout wire and the clock signal line can be ensured, and the display effect of the display panel can be improved.

Figure 11:
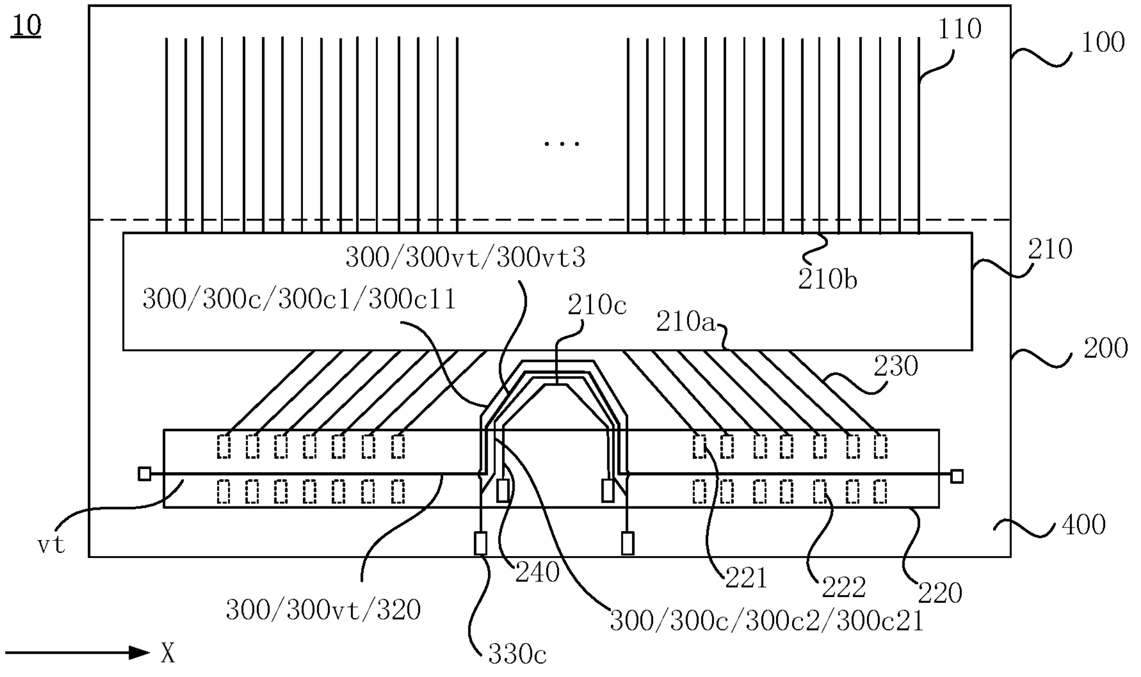
FIG. 11 is a schematic structural diagram of another display panel according to an embodiment of the present disclosure.

FIG. 11 is a schematic structural diagram of another display panel according to an embodiment of the present disclosure, the isolation signal line 300 includes a display test signal line 300*vt* and a common voltage signal line 300*c*. The common voltage signal line 300*c* includes a first common voltage signal line 300*c*1 and a second common voltage signal line 300*c*2. The first common voltage signal line 300*c*1 includes a first isolation portion 300*c*11, the second common voltage signal line 300*c*2 includes a second isolation portion 300*c*21, and the display test signal line 300*vt* includes a third isolation portion 300*vt*3. An orthographic projection of the first isolation portion 300*c*11 on the plane where the substrate 400 is located is between an orthographic projection of the third isolation portion **300*vt*3 on the plane where the substrate 400 is located and an orthographic projection of the fanout wire 230 on the plane where the substrate 400 is located. An orthographic projection of the second isolation portion 300*c*21 on the plane where the substrate 400 is located is between the orthographic projection of the third isolation portion 300*vt*3 on the plane where the substrate 400 is located and an orthographic projection of the clock signal line 240 on the plane where the substrate 400** is located.

Referring to FIG. 11, both the display test signal line **300*vt* and the common voltage signal line 300*c* included in the isolation signal line 300 can realize the reduction of signal interference between the clock signal line 240 and the fanout wire 230, ensuring the stable display of the display panel 10**.

Referring to FIG. 11, the common voltage signal line **300*c* includes the first common voltage signal line 300*c*1 and the second common voltage signal line 300*c*2. The first common voltage signal line 300*c*1 includes a first isolation portion 300*c*11, the second common voltage signal line 300*c*2 includes a second isolation portion 300*c*21, and the display test signal line 300*vt* includes a third isolation portion 300*vt*3. The first isolation portion 300*c*11, the second isolation portion 300*c*21, and the third isolation portion 300*vt*3 are located between the clock signal line 240 and the fanout wire 230, thereby providing multiple signal shielding effects to ensure accurate transmission of signals in the display panel 10**.

For example, referring to FIG. 11, the first common voltage signal line **300*c*1 and the second common voltage signal line 300*c*2 may be connected to the same common signal terminal 330*c*. In an embodiment, the first common voltage signal line 300*c*1 and the second common voltage signal line 300*c*2 may be two wires split from one common voltage signal line 300*c*, for ensuring shielding effects at different positions. An orthographic projection of the first isolation portion 300*c*11 on a side of the substrate 400 is located between the third isolation portion 300*vt*3 and the fanout wire 230, and an orthographic projection of the second isolation portion 300*c*21 on a side of the substrate 400 is located between the clock signal line 240 and the third isolation portion 300*vt*3. Multiple wires with fixed potentials are added between the clock signal line 240 and the fanout wire 230, so that the signal interference between the clock signal line 240 and the fanout wire 230 can be effectively prevented to ensure the display effect of the display panel 10**.

It is to be noted that when the isolation signal line includes the display test signal line and the common voltage signal line, and the common voltage signal line includes the first common voltage signal line **300*c*1 and the second common voltage signal line 300*c*2, the first common voltage signal line 300*c*1 includes the first isolation portion 300*c*11 located between the display test signal line 300*vt* and the fanout wire 230, and the second common voltage signal line 300*c*2 includes the second isolation portion 300*c*21 located between the display test signal line 300*vt* and the clock signal line 240. In this case, the display test signal line 300*vt* may or may not receive a fixed potential signal. In an embodiment, when the display test signal line 300*vt* receives a fixed potential signal, the first common voltage signal line 300*c*1, the display test signal line 300*vt* and the second common voltage signal line 300*c*2 all can further shield the coupling interference between the clock signal line 240 and the fanout wire 230, thereby further improving the stability of the display signal and the clock signal. Alternatively, when the display test signal line does not receive a fixed potential signal, the fixed potential signals provided through the first common voltage signal line 300*c*1 and the second common voltage signal line 300*c*2 can ensure a good isolation effect between the clock signal line 240 and the fanout wire 230**, and in this case, it is not necessary to provide an independent fixed potential signal for the display test signal line, that is, the driver chip or the flexible circuit board does not need to provide an independent fixed potential signal for the display test terminal, thus the simple control logic of the driver chip and the flexible circuit board can be ensured, and the working efficiency of the display panel or the flexible circuit board is relatively efficient.

Figure 12:
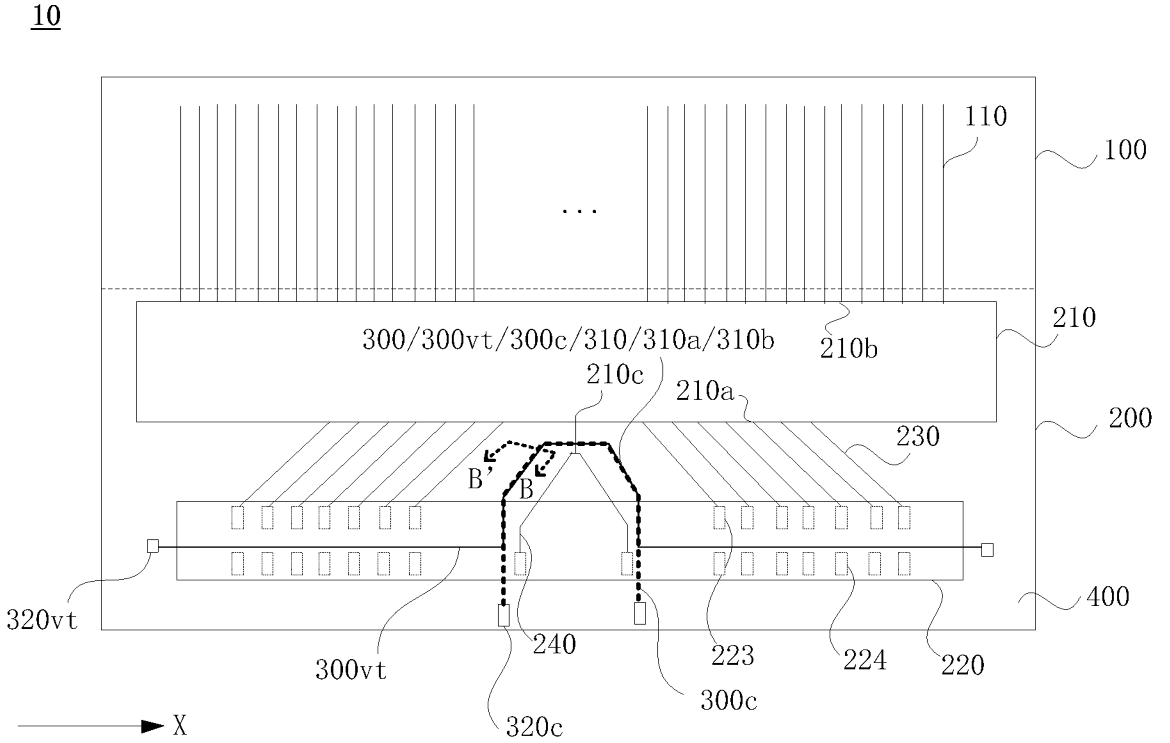
FIG. 12 is a schematic structural diagram of another display panel according to an embodiment of the present disclosure.
Figure 13:
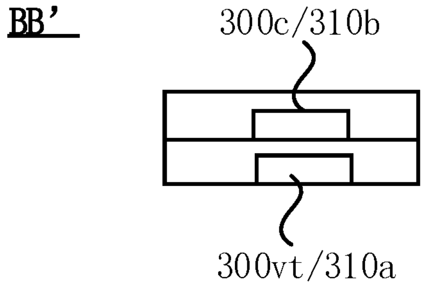
FIG. 13 is a schematic sectional view taken along B-B' in FIG. 12.
Figure 14:
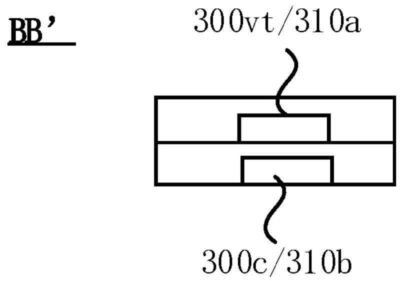
FIG. 14 is another schematic sectional view taken along B-B' in FIG. 12.

FIG. 12 is a schematic structural diagram of another display panel according to an embodiment of the present disclosure, FIG. 13 is a schematic sectional view taken along B-B' in FIG. 12, and FIG. 14 is another schematic sectional view taken along B-B' in FIG. 12. With reference to FIG. 12 to FIG. 14, the isolation signal line 300 includes a display test signal line **300*vt* and a common voltage signal line 300*c*. The isolation portion 310 includes a fourth isolation portion 310*a* and a fifth isolation portion 310*b* arranged in different layers, the display test signal line 300*vt* includes the fourth isolation portion 310*a*, and the common voltage signal line 300*c* includes the fifth isolation portion 310*b*. An orthographic projection of the fourth isolation portion 310*a* on the plane where the substrate 400 is located overlaps an orthographic projection of the fifth isolation portion 310*b* on the plane where the substrate 400** is located.

In an embodiment, referring to FIG. 12, the isolation portion 310 of the isolation signal line 300 is arranged between the clock signal line 240 and the fanout wire 230, and is used to reduce signal interference between the clock signal line 240 and the fanout wire 230. The isolation signal line 300 includes the display test signal line **300*vt* and the common voltage signal line 300*c*, a wire portion of the display test signal line 300*vt* between the clock signal line 240 and the fanout wire 230 is the fourth isolation portion 310*a*, and a wire portion of the common voltage signal line 300*c* between the clock signal line 240 and the fanout wire 230 is the fifth isolation portion 310*b***.

Further, the orthographic projection of the fourth isolation portion **310*a* on the plane in which the substrate 400 is located overlaps the orthographic projection of the fifth isolation portion 310*b* on the plane in which the substrate 400 is located, the fourth isolation portion 310*a* and the fifth isolation portion 310*b* are arranged in different layers, so that the space occupied by the entire isolation signal line can be reduced, thereby facilitating the narrow bezel design of the display panel 10. Illustratively, as for the positions of the fourth isolation portion 310*a* and the fifth isolation portion 310*b*, reference may be made to FIG. 13 and FIG. 14, the fourth isolation portion 310*a*, compared with the fifth isolation portion 310*b*, may be located on a side facing away from the substrate 400, or the fourth isolation portion 310*a*, compared with the fifth isolation portion 310*b*, may be located on a side facing the substrate 400**, which is not limited by the embodiments of the present disclosure.

It is to be noted that, in FIG. 12, since the fourth isolation portion **310*a* and the fifth isolation portion 310*b* are arranged in an overlapping manner, FIG. 12 schematically shows the common voltage signal line as a dashed line for illustrating the region between the fourth isolation portion 310*a* and the fifth isolation portion 310*b***.

Figure 15:
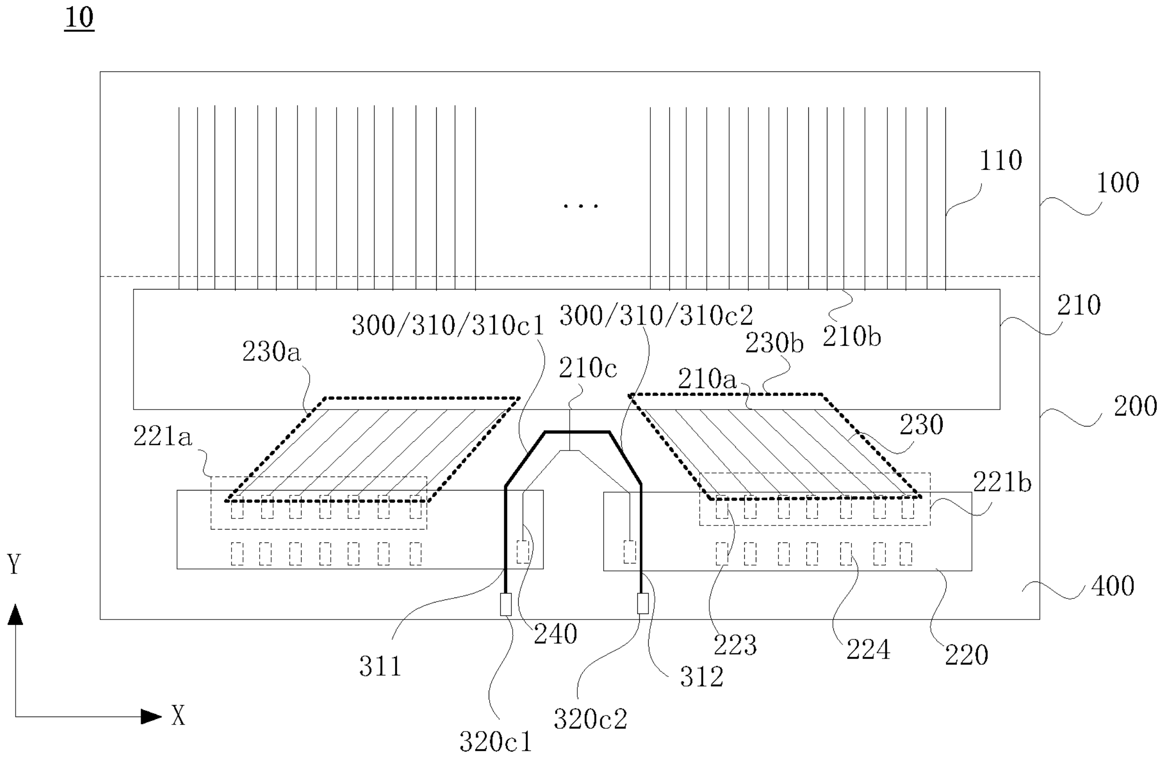
FIG. 15 is a schematic structural diagram of another display panel according to an embodiment of the present disclosure.

FIG. 15 is a schematic structural diagram of another display panel according to an embodiment of the present disclosure. Referring to FIG. 15, the isolation signal line 300 includes a common voltage signal line 300*c*. The common voltage signal line 300*c* includes the isolation portion 310. The isolation portion 310 includes a first isolation sub-segment 310*c*1 and a second isolation sub-segment 310*c*2. The first isolation sub-segment 310*c*1 is located between the first fanout wire group 230*a* and the clock signal line 240, the second isolation sub-segment 310*c*2 is located between the second fanout wire group 230*b* and the clock signal line 240, and the common voltage signal line 300*c* further includes a second connection portion 311 and a third connection portion 312. The display panel 10 further includes a first common voltage signal terminal 320*c*1 and a second common voltage signal terminal 320*c*2. The second connection portion 311 is electrically connected to the first common voltage signal terminal 320*c*1 and the first isolation sub-segment 310*c*1, respectively. The third connection portion 312 is electrically connected to the second common voltage signal terminal 320*c*2 and the second isolation sub-segment 310*c*2, respectively. In the first direction X, the third connection portion 312 is located on a side of the second isolation sub-segment 310*c*2 facing the second output terminal group 221*b*. The common voltage signal line 300*c* at least forms a semi-enclosed structure, the fanout wires 230 are located outside the semi-enclosed structure, and at least a portion of the clock signal line 240 is located inside the semi-enclosed structure.

In an embodiment, referring to FIG. 15, the isolation signal line 300 includes a common voltage signal line 300*c*. The common voltage signal line 300*c* includes an isolation portion 310, a second connection portion 311 and a third connection portion 312. The isolation portion 310 includes a first isolation sub-segment 310*c*1 and a second isolation sub-segment 310*c*2. The first isolation sub-segment 310*c*1 is located between the first fanout wire group 230*a* and the clock signal line 240, and the second isolation sub-segment 310*c*2 is located between the second fanout wire group 230*b* and the clock signal line 240. The first isolation sub-segment 310*c*1 and the second isolation sub-segment 310*c*2 can be used to avoid the signal interference between the clock signal line 240 and the fanout wire 230. The second connection portion 311 is used to electrically connect the first common voltage signal terminal 320*c*1 to the first isolation sub-segment 310*c*1, and the third connection portion 312 is used to electrically connect the second common voltage signal terminal 320*c*2 to the second isolation sub-segment 310*c*2. Further, the second connection portion 311 is located between the fanout wires 230 in the first fanout wire group 230*a* and the clock signal line 240, and the third connection portion 312 is located between the clock signal line 240 and the fanout wires 230 in the second fanout wire group 230*b*. In an embodiment, referring to FIG. 15, in the first direction X, the second connection portion 311 is located on a side of the first isolation sub-segment 310*c*1 facing the first output terminal group 221*a*, and the third connection portion 312 is located on a side of the second isolation sub-segment 310*c*2 facing the second output terminal group 221*b*. In a second direction, the second connection portion 311 is located on a side of the first isolation sub-segment 310*c*1 facing the first common voltage signal terminal 320*c*1, and the third connection portion 312 is located on a side of the second isolation sub-segment 310*c*2 facing the second common voltage signal terminal 320*c*2.

Further, referring to FIG. 15, the common voltage signal line 300*c* forms a semi-enclosed structure as shown in the figure according to the first isolation sub-segment 310*c*1, the second isolation sub-segment 310*c*2, the second connection portion 311 and the third connection portion 312. The fanout wires 230 in the first fanout wire group 230*a* and the fanout wires 230 in the second fanout wire group 230*b* are all located outside the semi-enclosed structure, and at least a portion of the clock signal line 240 is located in the semi-enclosed structure. In this way, the common voltage signal line 300*c* can isolate the clock signal line 240 from the fanout wires 230 in an all-round manner, the interference caused by the fanout wires 230 to the clock signal line 240 and the interference caused by the clock signal line 240 to the fanout wires 230 can be sufficiently blocked, the stability and accuracy of signals in the fanout wires 230 and the clock signal line 240 can be sufficiently ensured, and the display effect of the display panel is ensured.

Figure 16:
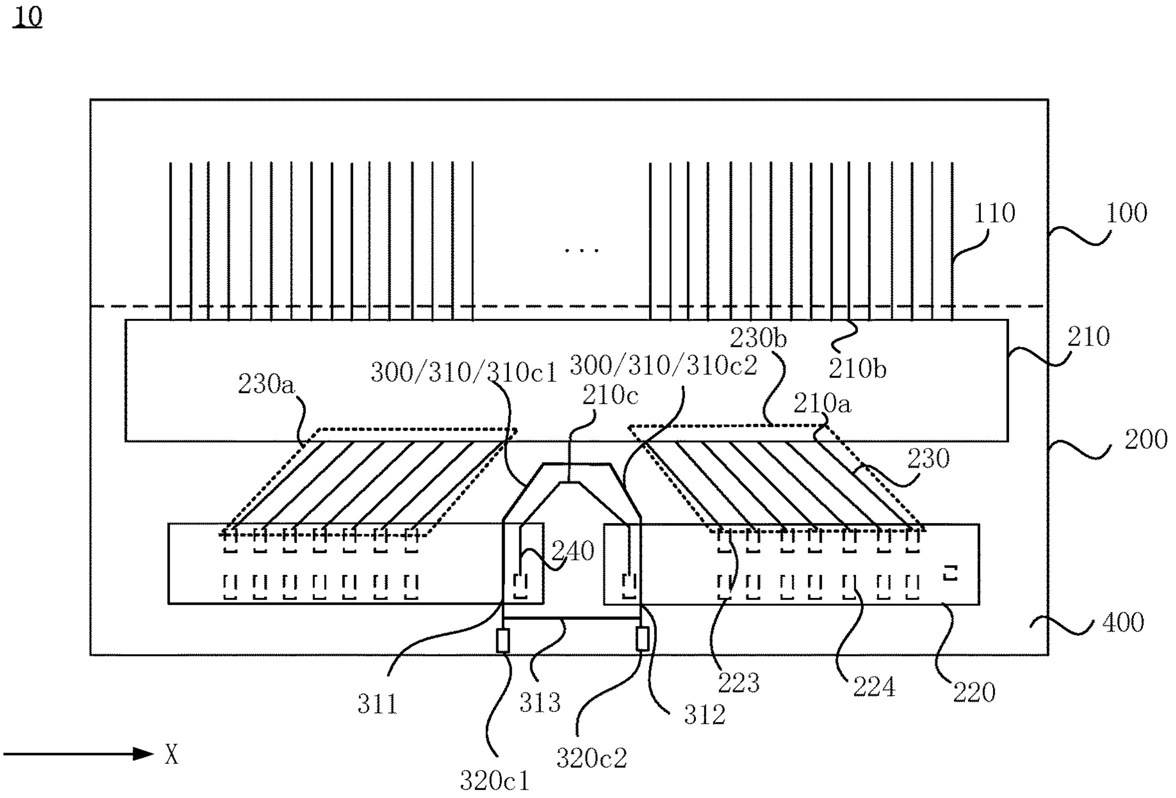
FIG. 16 is a schematic structural diagram of another display panel according to an embodiment of the present disclosure.

FIG. 16 is a schematic structural diagram of another display panel according to an embodiment of the present disclosure. Referring to FIG. 16, the common voltage signal line 300*c* further includes a fourth connection portion 313, the fourth connection portion 313 is electrically connected to the second connection portion 311 and the third connection portion 312, respectively, and the fourth connection portion 313 is located at a side of the isolation portion 310 facing away from the display region. The isolation portion 310, the second connection portion 311, the third connection portion 312 and the fourth connection portion 313 form a fully-enclosed structure, the fanout wires 230 are located outside the fully-enclosed structure, and at least a portion of the clock signal line 240 is located inside the fully-enclosed structure.

In an embodiment, referring to FIG. 16, the common voltage signal line 300*c* includes a first isolation sub-segment 310*c*1, a second isolation sub-segment 310*c*2, a second connection portion 311, a third connection portion 312 and a fourth connection portion 313. The second connection portion 311 and the third connection portion 312 are connected via the fourth connection portion 313 so that the common voltage signal line 300*c* may form a fully-enclosed structure through the isolation portion 310.

Further, referring to FIG. 16, the fanout wires 230 are all located outside the fully-enclosed structure formed by the common voltage signal line 300*c*, and at least a portion of the clock signal line 240 is located inside the fully-enclosed structure formed by the common voltage signal line 300*c*, so that the common voltage signal line 300*c* can isolate the clock signal line 240 from the fanout wires 230 in an all-round manner to completely block the interference of the fanout wires 230 to the clock signal line 240 and the interference of the clock signal line 240 to the fanout wires 230, thereby sufficiently ensuring the stability and accuracy of signals in the fanout wires 230 and the clock signal line 240, and ensuring the display effect of the display panel.

Figure 17:
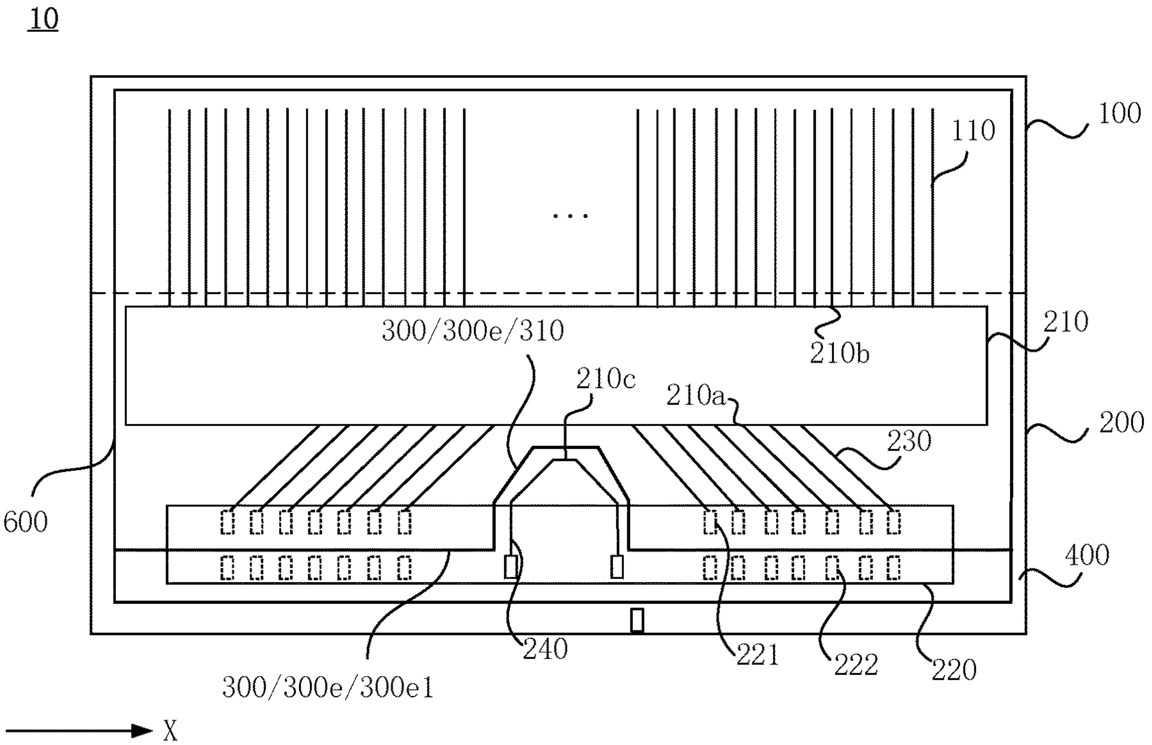
FIG. 17 is a schematic structural diagram of another display panel according to an embodiment of the present disclosure.

In an embodiment, FIG. 17 is a schematic structural diagram of another display panel according to an embodiment of the present disclosure. The display panel 10 further includes an electrostatic wire 600. The electrostatic wire 600 may lead out the static electricity generated in the display panel 10 in time, to prevent the static electricity from adversely affecting the devices in the display panel 10. Further, referring to FIG. 17, the isolation signal line 300 may include an electrostatic lead-out wire 300*e*, and the electrostatic lead-out wire 300*e* includes an electrostatic connection line 300*e*1 and an isolation portion 310. The electrostatic connection line 300*e*1 is electrically connected to the electrostatic wire 600, thereby an orthographic projection of the isolation portion 310 on the plane where the substrate 400 is located is between an orthographic projection of the clock signal line 240 on the plane where the substrate 400 is located and the orthographic projection of the fanout wire 230 on the plane where the substrate 400 is located, so that the isolation shielding effect of the isolation portion 310 on the signals in the fanout wires 230 and the signal in the clock signal line 240 can be ensured, and the stable transmission of the signals in the fanout wires 230 and the clock signal line 240 can be ensured.

Still referring to FIG. 2, the display panel 10 further includes multiple display voltage signal lines; and the common voltage signal line 300*c* is arranged to be insulated from the display voltage signal lines.

In an embodiment, the display panel 10 further includes multiple display voltage signal lines, for example, a positive power signal line PVDD or a negative power signal line PVEE, the categories of the display voltage signal lines are not limited by the embodiments of the present disclosure. Further, the common voltage signal line 300*c* used as the isolation signal line 300 is provided independently, that is, the common voltage signal line 300*c* is arranged to be insulated from the display voltage signal lines, in other words, the common voltage signal line does not need to be reused as the display voltage signal line, so that a high setting freedom degree of the common voltage signal line 300*c* can be ensured, and additional considerations of adjustment on the wiring of the display voltage signal lines or adjustment on the matching degree of the display voltage signal lines for the voltage signals are not required. The common voltage signal line 300*c* simply requires a single fixed potential terminal leading out from the flexible circuit board. The process has a low cost and a good signal isolation effect, and can further well ensure the display effect of the display panel 10.

Figure 18:
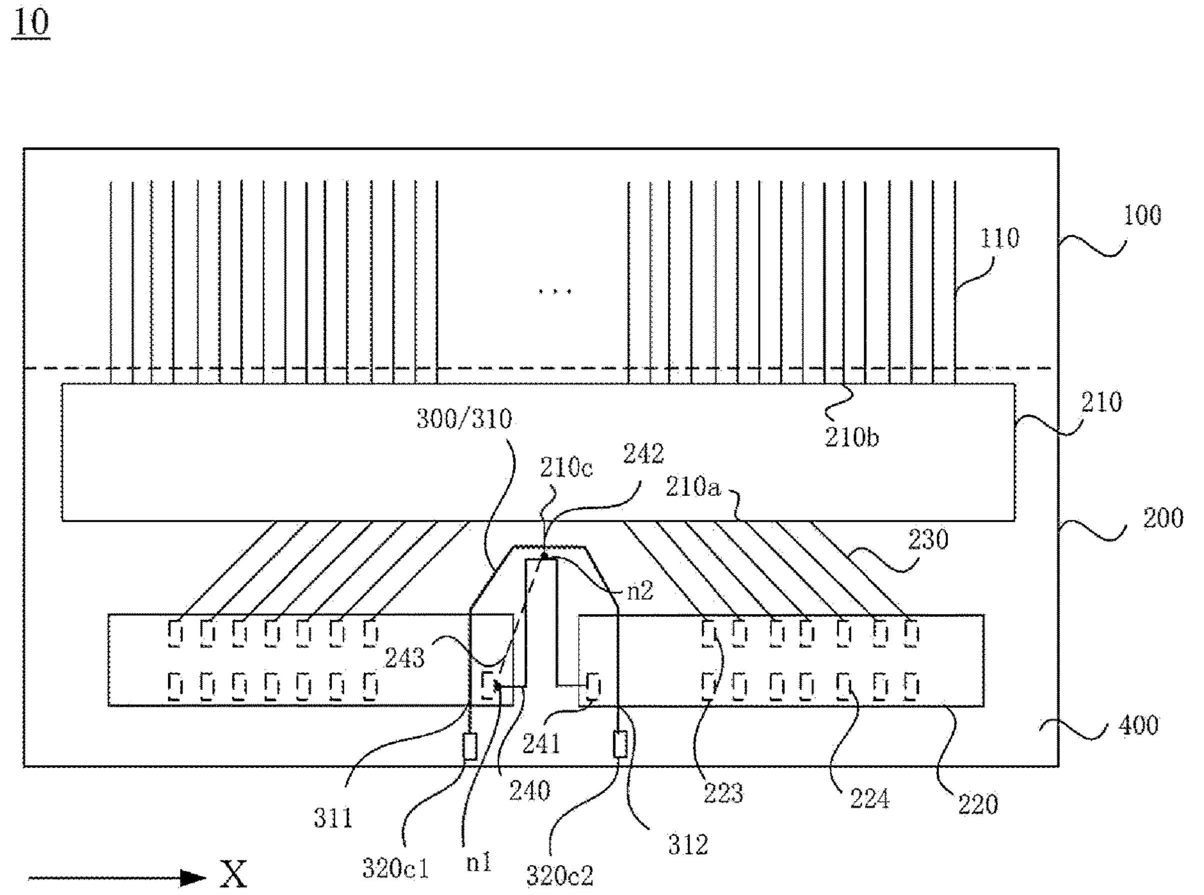
FIG. 18 is a schematic structural diagram of another display panel according to an embodiment of the present disclosure.

FIG. 18 is a schematic structural diagram of another display panel according to an embodiment of the present disclosure. Referring to FIG. 18, the display panel 10 further includes a clock signal terminal 241 and a clock signal jumper line 242. The clock signal line 240 is connected to the clock signal terminal 241 at a first node n1. The clock signal line 240 is connected to the clock signal jumper line 242 at a second node n2. The clock signal jumper line 242 is electrically connected to the demultiplexing circuit 210. At least a portion of the clock signal line 240 is located on a side of a virtual line 243 facing away from the fanout wire 230, and the virtual line 243 is a straight line segment connecting the first node n1 to the second node n2.

As shown in FIG. 18, the clock signal line 240 is electrically connected to the clock signal terminal 241, and the clock signal line 240 is further electrically connected to the demultiplexing circuit 210 through the clock signal jumper line 242, i.e., electrically connected to the control terminal 210*c* of the demultiplexing circuit 210. Further, the clock signal line 240 and the clock signal terminal 241 are connected at the first node n1, the clock signal line 240 and the clock signal jumper line 242 are connected at the second node n2, and the virtual line 243 connects the first node n1 to the second node n2. It is to be noted that the virtual line 243 is not really an existing wire, and the virtual line 243 is simply used to embody the wiring arrangement of the clock signal line 240.

Referring to FIG. 18, at least a portion of the clock signal line 240 is located on a side of the virtual line 243 facing away from the fanout wire 230, and the clock signal line 240 may be arranged on a side of the isolation signal line 300 facing away from the fanout wire 230 in an arrangement similar to an "L" shape. With this wiring arrangement, it is possible to increase the distance between the clock signal line 240 and the fanout wire 230, decrease the coupling between the clock signal line 240 and the fanout wire 230, ensure the stable transmission of signals in the fanout wire 230 and the clock signal line 240, and ensure the display effect of the display panel 10. Further, when the clock signal line 240 is arranged in the arrangement similar to the "L" shape, the wiring is relatively neat, the manufacturing process is relatively simple, and sufficient space can be left for arranging the isolation signal line 300.

Figure 19:
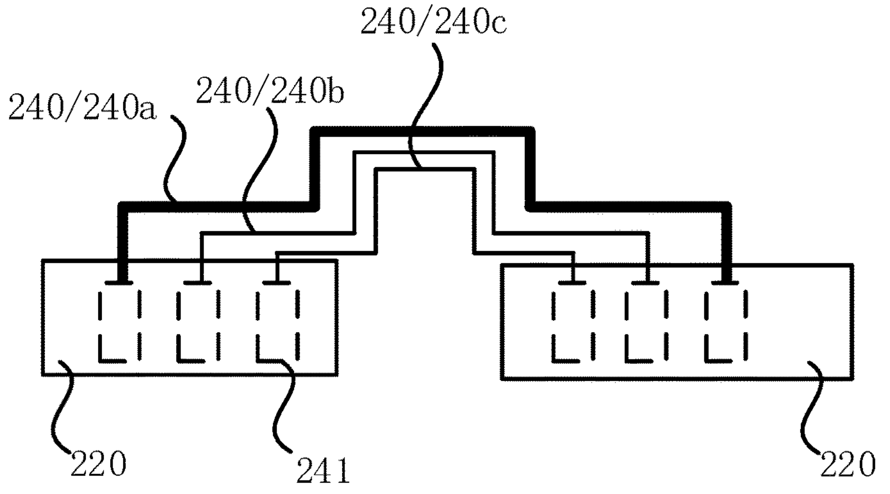
FIG. 19 is a schematic diagram showing a wiring of clock signal lines according to an embodiment of the present disclosure.
Figure 20:
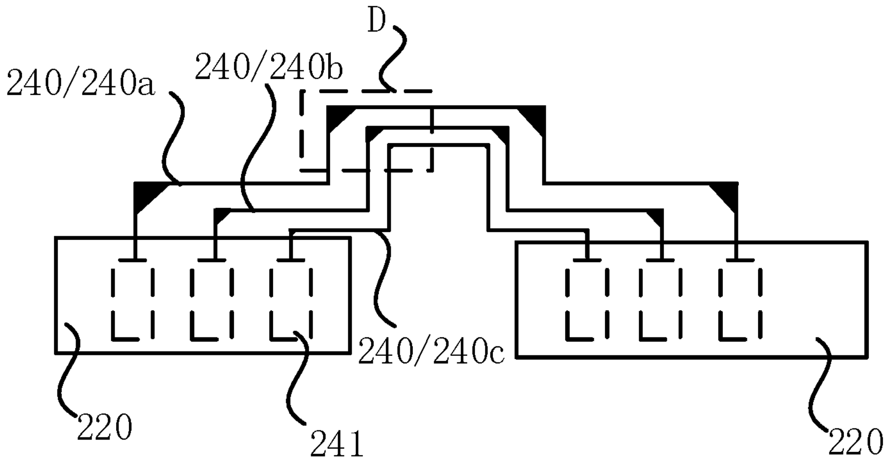
FIG. 20 is a schematic diagram showing another wiring of clock signal lines according to an embodiment of the present disclosure.
Figure 21:
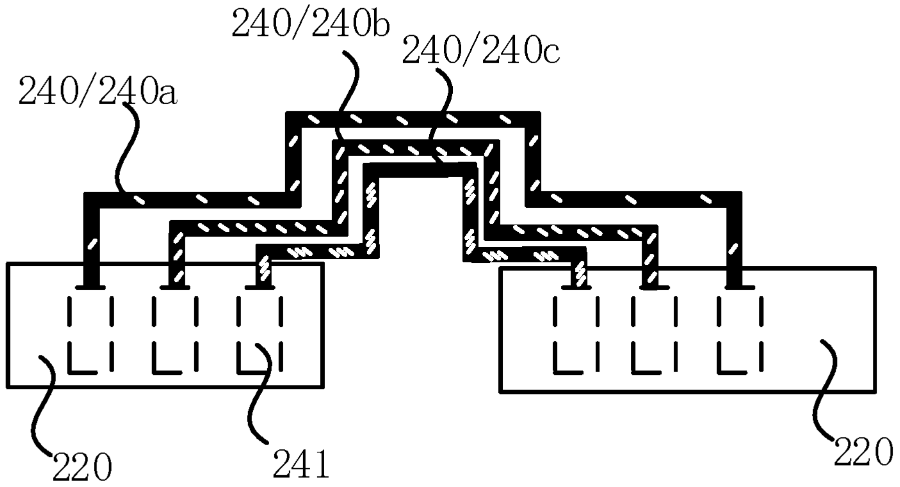
FIG. 21 is a schematic diagram showing another wiring of clock signal lines according to an embodiment of the present disclosure.

FIG. 19 is a schematic diagram showing the wiring of clock signal lines according to an embodiment of the present disclosure, FIG. 20 is a schematic diagram showing another wiring of clock signal lines according to an embodiment of the present disclosure, and FIG. 21 is a schematic diagram showing another wiring of clock signal lines according to an embodiment of the present disclosure. Referring to FIG. 19 to FIG. 21, the display panel 10 includes multiple clock signal lines 240, two of the multiple clock signal lines 240 have different extension lengths; and the two clock signal lines 240 with different extension lengths have signal line sub-segments with different widths.

Referring to the demultiplexing circuit shown in FIG. 3, the demultiplexing circuit serves as a multi-output circuit with one input terminal corresponding to multiple output terminals, and corresponds to at least two sets of switch units. Correspondingly, the clock signal line includes at least two groups of clock signal lines, enabling stages of the two groups of clock signal lines to have a timing difference, the number of the clock signal lines 240 is not limited by the embodiments of the present disclosure. It is illustrated by three clock signal lines 240 in FIG. 19 to FIG. 21, reference is made to the clock signal lines 240*a*, 240*b*, and 240*c* in the drawings.

Further, referring to FIG. 19 to FIG. 21, the extension lengths of different clock signal lines 240 are different, the extension length of the clock signal line 240*a* is larger than the extension length of the clock signal line 240*b*, and the extension length of the clock signal line 240*b* is larger than the extension length of the clock signal line 240*c*. In an embodiment, to ensure the consistency of the signals transmitted by the clock signal lines 240 as a whole on different wires, the impedances of the clock signal lines 240 at different positions may be adjusted so that the impedances between different clock signal lines 240 are equivalent.

For example, referring to FIG. 19, the widths of the clock signal lines 240 at different positions are adjusted, the width of the clock signal line 240*a* is adjusted to be larger than the width of the clock signal line 240*b*, and the width of the clock signal line 240*b* is adjusted to be larger than the width of the clock signal line 240*c*. The line with a larger width correspondingly has a reduced impedance, the clock signal line 240*a* in FIG. 19 has a larger length, and the impedance of the clock signal line 240*a* can be ensured not too large by increasing its width, so the signal line sub-segment of the clock signal line 240 may have an increased width when having a larger extension length, thereby ensuring that the overall impedances of the clock signal lines 240 are balanced, and ensuring display uniformity of the display panel 10.

For example, referring to FIG. 20, the widths, at the corners, of the clock signal lines 240 at different positions are adjusted, the width of the clock signal line 240*a* at the corner is adjusted to be larger than the width of the clock signal line 240*b* at the corner, and the width of the clock signal line 240*b* at the corner is adjusted to be larger than the width of the clock signal line 240*c* at the corner. Similarly, the clock signal line 240*a* in FIG. 17 has a relatively large length, it is possible to ensure that the impedance of the clock signal line 240*a* is not too large by increasing the width. Therefore, the signal line sub-segment of the clock signal line 240 can have an increased width at its corner when having a larger extension length, thereby ensuring that the overall impedances of the clock signal lines 240 are balanced, and further ensuring that the display uniformity of the display panel 10.

For example, referring to FIG. 21, the clock signal line 240 may be notched on the wire to adjust its impedance. Referring to FIG. 21, since the length of the clock signal line 240*a* is relatively large, it is possible to ensure that the impedance of the clock signal line 240 is not excessively large by reducing the notched area of the wire. Therefore, when a signal line sub-segment of the clock signal line 240 has a larger extension length, the wire of the signal line sub-segment of the clock signal line 240 may have a reduced notched area compared with a signal line sub-segment with a smaller extension length, thereby ensuring that the overall impedances of the clock signal lines 240 are balanced, and further ensuring that the display uniformity of the display panel 10.

Further, for the adjustment of the impedances of the clock signal lines 240 with different extension lengths, the adjustment to the width of the wire, the adjustment to the width of the wire at the corner, the adjustment to the notched area of the wire, and the adjustment to the notched area at the corner described above may be partially or all combined, which is not limited by the embodiments of the present disclosure. In other words, no matter whether the widths of the wires are different, the widths of the wires at the corners are gradually changed, or notches are formed in the wires, the essence is to adjust the impedances at different degrees by adjusting the widths of the wires, to ensure that the impedances of the clock signal lines 240 of different lengths are relatively balanced.

Figure 22:
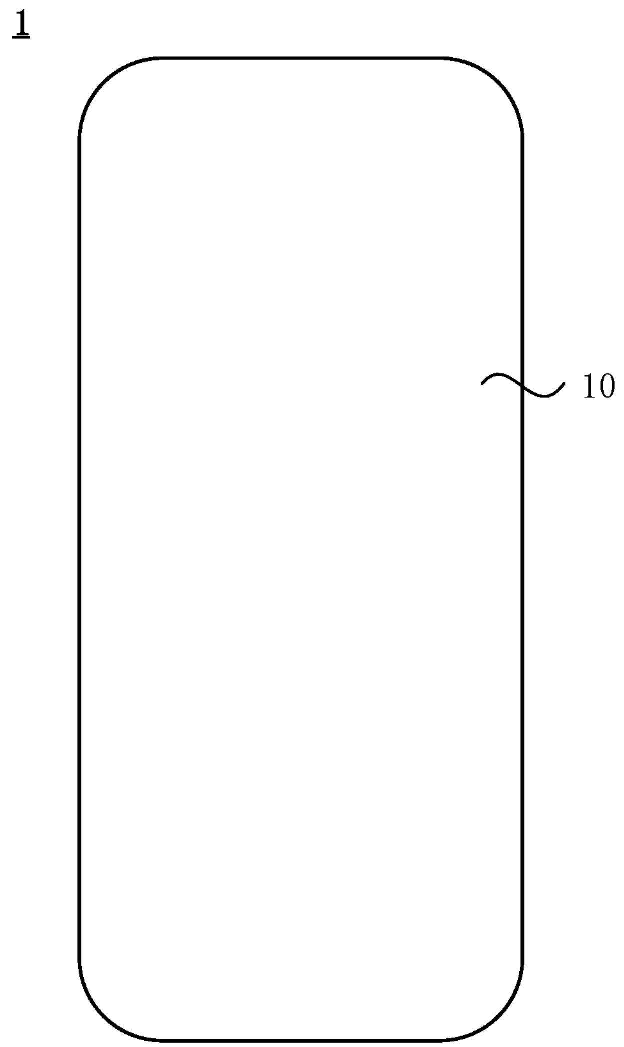
FIG. 22 is a schematic structural diagram of a display device according to an embodiment of the present disclosure.

Based on the same inventive concept, a display device is further provided according to an embodiment of the present disclosure. FIG. 22 is a schematic structural diagram of a display device according to an embodiment of the present disclosure. The display device includes any of the display panels according to the above embodiments. For example, referring to FIG. 22, the display device 1 includes the display panel 10. Therefore, the display device also has the beneficial effects of the display panel described in the preceding embodiments, and for the same details, reference may be made to the above description for the display panel to understand, which are not described hereinafter.

The display device 1 according to an embodiment of the present disclosure may be a mobile phone shown in FIG. 22, or may be any electronic product having a display function, including but not limited to the following categories: a television, a notebook computer, a desktop display, a tablet computer, a digital camera, a smart bracelet, smart glasses, an in-vehicle display, industrial control equipment, a medical display screen, a touch interactive terminal, and the like, which is not particularly limited by the embodiments of the present disclosure.

It is to be noted that the preceding are only alternative embodiments of the present disclosure and technical principles used therein. It will be understood by the person skilled in the art that the present disclosure is not limited to the specific embodiments described herein. The person skilled in the art can make various apparent changes, readjustments and substitutions without departing from the scope of the present disclosure. Therefore, while the present disclosure has been described in detail through the above-described embodiments, the present disclosure is not limited to the above-described embodiments and may include more other equivalent embodiments without departing from the concept of the present disclosure. The scope of the present disclosure is determined by the scope of the appended claims.

What is claimed is:

1. A display panel, comprising a substrate, a display region and a non-display region, wherein the display region comprises a plurality of data lines, and the non-display region comprises a demultiplexing circuit, a fanout wire, and a clock signal line; an input terminal of the demultiplexing circuit is electrically connected to the fanout wire, an output terminal of the demultiplexing circuit is electrically connected to a data line of the data lines, and a control terminal of the demultiplexing circuit is electrically connected to the clock signal line; and the display panel further comprises an isolation signal line, the isolation signal line comprises an isolation portion, and an orthographic projection of the isolation portion on a plane in which the substrate is located is between an orthographic projection of the clock signal line on the plane in which the substrate is located and an orthographic projection of the fanout wire on the plane in which the substrate is located;

wherein the isolation signal line comprises a display test signal line, and the display test signal line comprises at least one of a display test switch signal line and a display test data signal line.

2. The display panel according to claim 1, wherein the display panel comprises a first fanout wire group and a second fanout wire group, and the first fanout wire group and the second fanout wire group each comprise a plurality of fanout wires;

the display panel further comprises a first output terminal group and a second output terminal group, each of the first output terminal group and the second output terminal group comprises a plurality of output bonding terminals, the plurality of fanout wires in the first fanout wire group are electrically connected to the plurality of output bonding terminals in the first output terminal group, and the plurality of fanout wires in the second fanout wire group are electrically connected to the output bonding terminals in the second output terminal group; and the first output terminal group and the second output terminal group are arranged in a first direction, wherein the first direction is parallel to the plane in which the substrate is located;

and in the first direction, at least a portion of the clock signal line is located between the first output terminal group and the second output terminal group.

3. The display panel according to claim 2, wherein the display panel comprises a first driver chip and a second driver chip, wherein the first driver chip is bound and electrically connected to the first output terminal group, and the second driver chip is bound and electrically connected to the second output terminal group.

4. The display panel according to claim 2, wherein the isolation signal line further comprises a common voltage signal line;

the common voltage signal line comprises the isolation portion, and the isolation portion comprises a first isolation sub-segment and a second isolation sub-segment, the first isolation sub-segment is located between the first fanout wire group and the clock signal line, and the second isolation sub-segment is located between the second fanout wire group and the clock signal line;

the common voltage signal line further comprises a second connection portion and a third connection portion;

the display panel further comprises a first common voltage signal terminal and a second common voltage signal terminal;

the second connection portion is electrically connected to the first common voltage signal terminal and the first isolation sub-segment, respectively; and the third connection portion is electrically connected to the second common voltage signal terminal and the second isolation sub-segment, respectively; and the isolation portion, the second connection portion and the third connection portion form at least a semi-enclosed structure, the plurality of fanout wires in the first fanout wire group and the second fanout wire group are located outside the semi-enclosed structure, and at least a portion of the clock signal line is located inside the semi-enclosed structure.

5. The display panel according to claim 4, wherein the common voltage signal line further comprises a fourth connection portion, the fourth connection portion is electrically connected to the second connection portion and the third connection portion, respectively, and the fourth connection portion is located on a side of the isolation portion facing away from the display region; and the isolation portion, the second connection portion, the third connection portion and the fourth connection portion form a fully-enclosed structure, and the plurality of fanout wires in the first fanout wire group and the second fanout wire group are located outside the fully-enclosed structure, and at least a portion of the clock signal line is located inside the fully-enclosed structure.

6. The display panel according to claim 4, wherein the display panel further comprises a plurality of display voltage signal lines, and the common voltage signal line is arranged to be insulated from the plurality of display voltage signal lines.

7. The display panel according to claim 1, wherein a film layer in which the isolation portion is located is not out of a film layer range defined by a film layer in which the fanout wire is located and a film layer in which the clock signal line is located.

8. The display panel according to claim 7, wherein the isolation portion is arranged in a same layer as at least one of the fanout wire and the clock signal line.

9. The display panel according to claim 7, wherein the fanout wire and the clock signal line are arranged in different layers, and the film layer in which the isolation portion is located is between the film layer in which the fanout wire is located and the film layer in which the clock signal line is located.

10. The display panel according to claim 1, wherein the isolation signal line further comprises a fixed potential signal line.

11. The display panel according to claim 10, wherein the isolation signal line further comprises at least one of a common voltage signal line and an electrostatic lead-out wire.

12. The display panel according to claim 11, wherein the display panel comprises a display test signal terminal;

the display test signal line comprises the isolation portion and a first connection portion, and the first connection portion is electrically connected to the display test signal terminal and the isolation portion, respectively;

the display panel further comprises an input bonding terminal and an output bonding terminal, and both the input bonding terminal and the output bonding terminal are connected to a driver chip in a bonding manner; and an orthographic projection of a portion of the first connection portion on the plane in which the substrate is located is between an orthographic projection of the input bonding terminal on the plane in which the substrate is located and an orthographic projection of the output bonding terminal on the plane in which the substrate is located.

13. The display panel according to claim 11, wherein the isolation signal line comprises the display test signal line and the common voltage signal line;

the common voltage signal line comprises a first common voltage signal line and a second common voltage signal line; the first common voltage signal line comprises a first isolation portion, the second common voltage signal line comprises a second isolation portion, and the display test signal line comprises a third isolation portion; and an orthographic projection of the first isolation portion on the plane in which the substrate is located is between an orthographic projection of the third isolation portion on the plane in which the substrate is located and an orthographic projection of the fanout wire on the plane in which the substrate is located, and an orthographic projection of the second isolation portion on a plane in which the substrate is located is between the orthographic projection of the third isolation portion on the plane in which the substrate is located and an orthographic projection of the clock signal line on the plane in which the substrate is located.

14. The display panel according to claim 11, wherein the isolation signal line comprises the display test signal line and the common voltage signal line;

the isolation portion comprises a fourth isolation portion and a fifth isolation portion which are arranged in different layers, the display test signal line comprises the fourth isolation portion, and the common voltage signal line comprises the fifth isolation portion; and an orthographic projection of the fourth isolation portion on the plane in which the substrate is located overlaps an orthographic projection of the fifth isolation portion on the plane in which the substrate is located.

15. The display panel according to claim 1, wherein the display panel further comprises a clock signal terminal and a clock signal jumper line, wherein the clock signal line is connected to the clock signal terminal at a first node and is connected to the clock signal jumper line at a second node, and the clock signal jumper line is electrically connected to the demultiplexing circuit; and at least a portion of the clock signal line is located on a side of a virtual line facing away from the fanout wire, wherein the virtual line is a straight-line segment connecting the first node to the second node.

16. The display panel according to claim 1, wherein the display panel comprises a plurality of clock signal lines, and two clock signal lines in the plurality of clock signal lines have different extension lengths; and the two clock signal lines have signal line sub-segments with different widths.

17. A display device, comprising a display panel, wherein the display panel comprises a substrate, a display region, and a non-display region, wherein the display region comprises a plurality of data lines, and the non-display region comprises a demultiplexing circuit, a fanout wire, and a clock signal line; an input terminal of the demultiplexing circuit is electrically connected to the fanout wire, an output terminal of the demultiplexing circuit is electrically connected to a data line of the data lines, and a control terminal of the demultiplexing circuit is electrically connected to the clock signal line; and the display panel further comprises an isolation signal line, the isolation signal line comprises an isolation portion, and an orthographic projection of the isolation portion on a plane in which the substrate is located is between an orthographic projection of the clock signal line on the plane in which the substrate is located and an orthographic projection of the fanout wire on the plane in which the substrate is located;

wherein the isolation signal line comprises a display test signal line, and the display test signal line comprises at least one of a display test switch signal line and a display test data signal line.

18. The display device according to claim 17, wherein the display panel comprises a first fanout wire group and a second fanout wire group, and the first fanout wire group and the second fanout wire group each comprise a plurality of fanout wires;

the display panel further comprises a first output terminal group and a second output terminal group, each of the first output terminal group and the second output terminal group comprises a plurality of output bonding terminals, the plurality of fanout wires in the first fanout wire group are electrically connected to the plurality of output bonding terminals in the first output terminal group, and the plurality of fanout wires in the second fanout wire group are electrically connected to the output bonding terminals in the second output terminal group; and the first output terminal group and the second output terminal group are arranged in a first direction, wherein the first direction is parallel to the plane in which the substrate is located; and in the first direction, at least a portion of the clock signal line is located between the first output terminal group and the second output terminal group.

19. The display device according to claim 18, wherein the display panel further comprises a first driver chip and a second driver chip, wherein the first driver chip is bound and electrically connected to the first output terminal group, and the second driver chip is bound and electrically connected to the second output terminal group.

20. The display device according to claim 17, wherein a film layer in which the isolation portion is located is not out of a film layer range defined by a film layer in which the fanout wire is located and a film layer in which the clock signal line is located.

* * * * *